United States Patent
Moroguchi et al.

(10) Patent No.: US 12,383,963 B2
(45) Date of Patent: Aug. 12, 2025

(54) CUTTING TOOL

(71) Applicant: Sumitomo Electric Hardmetal Corp., Itami (JP)

(72) Inventors: Hironari Moroguchi, Itami (JP); Yuki Tsutsumiuchi, Itami (JP); Nozomi Tsukihara, Itami (JP); Akihiko Ueda, Itami (JP); Satoru Kukino, Itami (JP)

(73) Assignee: SUMITOMO ELECTRIC HARDMETAL CORP., Itami (JP)

(*) Notice: Subject to any disclaimer, the term of this patent is extended or adjusted under 35 U.S.C. 154(b) by 0 days.

(21) Appl. No.: 18/575,320

(22) PCT Filed: Jun. 29, 2022

(86) PCT No.: PCT/JP2022/026003
§ 371 (c)(1),
(2) Date: Dec. 29, 2023

(87) PCT Pub. No.: WO2023/277077
PCT Pub. Date: Jan. 5, 2023

(65) Prior Publication Data
US 2024/0261868 A1    Aug. 8, 2024

(30) Foreign Application Priority Data

Jun. 30, 2021 (WO) .................. PCT/JP2021/024828

(51) Int. Cl.
| | | |
|---|---|---|
| *B23B 27/14* | (2006.01) | |
| *C23C 14/06* | (2006.01) | |
| *C23C 14/30* | (2006.01) | |
| *C23C 14/32* | (2006.01) | |

(52) U.S. Cl.
CPC ........ *B23B 27/148* (2013.01); *C23C 14/0635* (2013.01); *C23C 14/0641* (2013.01);
(Continued)

(58) Field of Classification Search
CPC ............ B23B 27/148; B23B 2228/105; C23C 14/0635; C23C 14/0641; C23C 14/0647;
(Continued)

(56) References Cited

U.S. PATENT DOCUMENTS

| | | | |
|---|---|---|---|
| 2017/0266733 A1* | 9/2017 | Sato | ...................... C23C 14/325 |
| 2019/0017178 A1 | 1/2019 | Mori | |
| 2019/0061013 A1* | 2/2019 | Hirano | ................ C23C 14/0641 |

FOREIGN PATENT DOCUMENTS

| | | |
|---|---|---|
| JP | 2000-129466 A | 5/2000 |
| JP | 2002-096205 A | 4/2002 |

(Continued)

OTHER PUBLICATIONS

Translation to English of WO 2013081232 via WIPO, patentscope. accessed Jun. 3, 2024 (Year: 2013).*

(Continued)

*Primary Examiner* — Donald M Flores, Jr.
(74) *Attorney, Agent, or Firm* — XSENSUS LLP

(57) ABSTRACT

A cutting tool comprises a substrate and a coating film disposed on the substrate, wherein the coating film comprises a first layer and a second layer; the first layer has a hardness $H_1$ of 25 GPa or more and 40 GPa or less; the second layer has a hardness $H_2$ satisfying $0.5 \times H_1 \leq H_2 \leq 0.9 \times H_1$; and at least one of a ratio $I_{(200)}/(I_{(200)}+I_{(111)}+I_{(220)})$ of $I_{(200)}$ of (200) plane to a sum of X-ray diffraction intensity $I_{(200)}$ of (200) plane, X-ray diffraction intensity $I_{(111)}$ of (111) plane, and X-ray diffraction intensity $I_{(220)}$ of (220) plane of the coating film, a ratio $I_{(111)}/(I_{(200)}+I_{(111)}+I_{(220)})$ of $I_{(111)}$ to the sum, and a ratio $I_{(220)}/(I_{(200)}+I_{(111)}+I_{(220)})$ of $I_{(220)}$ to the sum is 0.45 or more.

16 Claims, 5 Drawing Sheets

(52) U.S. Cl.
    CPC ...... *C23C 14/0647* (2013.01); *C23C 14/0652* (2013.01); *C23C 14/30* (2013.01); *C23C 14/32* (2013.01); *B23B 2228/105* (2013.01)

(58) Field of Classification Search
    CPC ............ C23C 14/0652; C23C 14/0658; C23C 14/0664; B32B 27/148
    See application file for complete search history.

(56) References Cited

FOREIGN PATENT DOCUMENTS

| | | |
|---|---|---|
| JP | 2002-144111 A | 5/2002 |
| JP | 2003-034858 A | 2/2003 |
| JP | 2003-305601 A | 10/2003 |
| JP | 2005-138211 A | 6/2005 |
| JP | 2006-299399 A | 11/2006 |
| JP | 2008-279562 A | 11/2008 |
| JP | 2010-284787 A | 12/2010 |
| JP | 2012-045650 A | 3/2012 |
| JP | 2018-069433 A | 5/2018 |
| WO | 2013/081232 A1 | 6/2013 |
| WO | 2017/111073 A1 | 6/2017 |

OTHER PUBLICATIONS

Written Opinion mailed on Aug. 16, 2022, received for PCT Application PCT/JP2022/026003, filed on Jun. 29, 2022, 17 pages including English Translation.

* cited by examiner

CUTTING TOOL

CROSS-REFERENCE TO RELATED APPLICATIONS

The present application is based on PCT filing PCT/JP2022/026003, filed Jun. 29, 2022, which claims priority from International Application PCT/JP2021/024828, filed Jun. 30, 2021, the entire contents of each are incorporated herein by reference.

TECHNICAL FIELD

The present disclosure relates to a cutting tool.

BACKGROUND ART

In order to extend the service life of cutting tools, various studies have been made. In Japanese Patent Laying-Open No. 2018-69433 (PTL 1), disclosed is a cutting tool having a coating film including a compound layer with a composition $Ti_xM_{1-x}C_yN_{1-y}$ (M is one or more elements selected from the group consisting of group IV elements, group V elements and group VI elements of the periodic table, Al, Si and B (excluding Ti), wherein x and y satisfy $0.2 \leq x \leq 1$ and $0 \leq y \leq 1$), and an elastic recovery rate of 52% or more.

CITATION LIST

Patent Literature

PTL 1: Japanese Patent Laying-Open No. 2018-69433

SUMMARY OF INVENTION

A cutting tool of the present disclosure relates to a cutting tool comprising a substrate and a coating film disposed on the substrate, wherein
the coating film comprises a first layer and a second layer;
the first layer has a hardness $H_1$ of 25 GPa or more and 40 GPa or less;
the second layer has a hardness $H_2$ satisfying $0.5 \times H_1 \leq H_2 \leq 0.9 \times H_1$; and
at least one of a ratio $I_{(200)}/(I_{(200)}+I_{(111)}+I_{(220)})$ of $I_{(200)}$ of (200) plane to a sum of X-ray diffraction intensity $I_{(200)}$ of (200) plane, X-ray diffraction intensity $I_{(111)}$ of (111) plane, and X-ray diffraction intensity $I_{(220)}$ of (220) plane of the coating film, a ratio $I_{(111)}/(I_{(200)}+I_{(111)}+I_{(220)})$ of $I_{(111)}$ to the sum, and a ratio $I_{(220)}/(I_{(200)}+I_{(111)}+I_{(220)})$ of $I_{(220)}$ to the sum is 0.45 or more.

DETAILED DESCRIPTION

Figure 1:
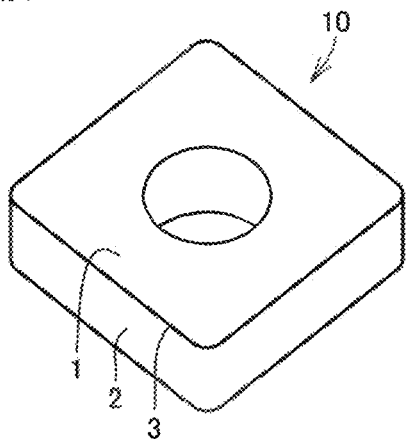
FIG. 1 is a perspective view showing an aspect of a cutting tool.

Problem to be Solved by the Present Disclosure

In recent years, cutting tools tend to be exposed to harsh cutting conditions due to requirement for high-load cutting. In the current situation, cutting tools that can be used stably under harsh cutting conditions, in other words, cutting tools that have a sufficiently long life, have not yet been provided. In particular, in high-load cutting such as cutting of high-hardness materials such as hardened steel (especially high-load cutting such as intermittent machining), the peeling resistance and chipping resistance are insufficient in some cases. Therefore, a cutting tool having a long tool life has been required also in high-load cutting (especially high-load cutting such as intermittent machining) such as cutting of high-hardness materials such as hardened steel.

Accordingly, an object of the present disclosure is to provide a cutting tool having a long tool life even in high-load cutting of high-hardness materials.

Advantageous Effect of the Present Disclosure

According to the present disclosure, a cutting tool having a long tool life even in high-load cutting of high-hardness materials can be provided.

DESCRIPTION OF EMBODIMENTS

First, embodiments of the present disclosure are listed and explained.

(1) A cutting tool comprising a substrate and a coating film disposed on the substrate, wherein
the coating film comprises a first layer and a second layer;
the first layer has a hardness $H_1$ of 25 GPa or more and 40 GPa or less;
the second layer has a hardness $H_2$ satisfying $0.5 \times H_1 \leq H_2 \leq 0.9 \times H_1$; and
at least one of a ratio $I_{(200)}/(I_{(200)}+I_{(111)}+I_{(220)})$ of $I_{(200)}$ of (200) plane to a sum of X-ray diffraction intensity $I_{(200)}$ of (200) plane, X-ray diffraction intensity $I_{(111)}$ of (111) plane, and X-ray diffraction intensity $I_{(220)}$ of (220) plane of the coating film, a ratio $I_{(111)}/(I_{(200)}+I_{(200)}+I_{(220)})$ of $I_{(111)}$ to the sum, and a ratio $I_{(220)}/(I_{(200)}+I_{(111)}+I_{(220)})$ of $I_{(220)}$ to the sum is 0.45 or more.

The cutting tool of the present disclosure can have a long tool life even in high-load cutting of high-hardness materials.

(2) In item (1) described above, it is preferable that the first layer have a thickness of 0.2 μm or more and 10 μm or less. Thereby, the abrasion resistance of the cutting tool is further improved.

(3) In item (1) or (2) described above, it is preferable that the second layer have a thickness of 0.2 µm or more and 10 µm or less. Thereby, the chipping resistance of the cutting tool and the peeling resistance of the cutting tool is further improved.

(4) In any one of items (1) to (3) described above, it is preferable that a ratio $T_1/T_2$ of a thickness $T_1$ of the first layer to a thickness $T_2$ of the second layer be 0.02 or more and 50 or less. Thereby, the balance among the abrasion resistance, peeling resistance and chipping resistance of the cutting tool is further improved.

(5) In any one of items (1) to (4), it is preferable that the first layer comprise a
first unit layer,
the first unit layer be composed of $Ti_xAl_yM_{1-x-y}C_zN_{1-z}$;
M be one element selected from the group consisting of zirconium, hafnium, group V elements and group VI elements of the periodic table, silicon, boron, and yttrium;
x be 0.20 or more and 0.99 or less.
y be 0.01 or more and 0.80 or less,
1-x-y be 0.01 or more and 0.20 or less, and
z be 0 or more and 1 or less. Thereby, the abrasion resistance of the cutting tool is further improved.

(6) In item (5) described above, it is preferable that the first layer further comprise a second unit layer,
the second unit layer be composed of $Al_mCr_{1-m}N$.
m be 0 or more and 0.8 or less,
the first unit layer have a thickness of 5 nm or more and 50 nm or less.
the second unit layer have a thickness of 5 nm or more and 50 nm or less, and
the first unit layer and the second unit layer be alternately laminated. Thereby, the abrasion resistance of the cutting tool is further improved.

(7) In item (5) described above, it is preferable that the first layer further comprise a third unit layer,
the third unit layer be composed of $Ti_{1-n}Al_nN$,
n be 0 or more and 0.8 or less,
the first unit layer have a thickness of 5 nm or more and 50 nm or less.
the third unit layer have a thickness of 5 nm or more and 50 nm or less, and
the first unit layer and the third unit layer be alternately laminated. Thereby, the abrasion resistance of the cutting tool is further improved.

(8) In any one of items (1) to (7) described above, it is preferable that the second layer comprise a fourth unit layer,
the fourth unit layer be composed of $Ti_aAl_bC_cN_{1-c}$.
a be 0.2 or more and 1.0 or less,
b be 0 or more and 0.8 or less, and
c be 0 or more and 1 or less. Thereby, the chipping resistance of the cutting tool and the peeling resistance of the cutting tool are further improved.

DETAILS OF THE EMBODIMENTS OF THE PRESENT DISCLOSURE

A specific example of the cutting tool in an embodiment of the present disclosure (hereinafter also referred to as "present embodiment") is explained with reference to drawings. In the drawings of the present disclosure, the same reference sign represents the same part or a corresponding part. Dimensions such as length, width, thickness, depth, etc., are appropriately changed for clarification and simplification of drawings, not necessarily representing actual dimensions.

In the present specification, an expression in the form of "A to B" means to include the upper limit and the lower limit of a range (in other words, A or more and B or less). In the case where A has no unit added while B has a unit added, the unit of A and the unit of B are the same.

In the present specification, in the case where a compound or the like is represented by a chemical formula without particular limitation on the atomic ratio, all the conventionally known atomic ratios are included, not necessarily limited to the stoichiometric range alone. For example, a description "TiAlSiN" allows the ratio of the number of atoms constituting TiAlSiN to include all the conventionally known atomic ratios.

In the present specification, individual planes in crystallographic description are represented in ( ).

Embodiment 1: Cutting Tool

Figure 2:
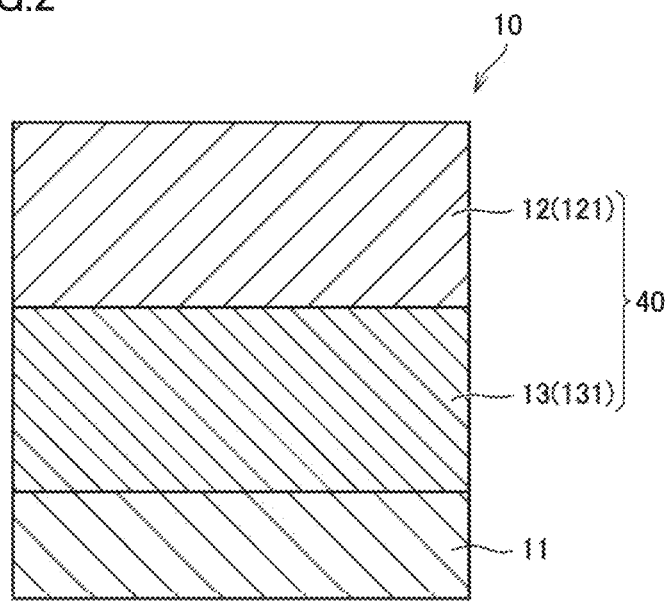
FIG. 2 is a schematic cross-sectional view showing a cutting tool in an aspect of the present embodiment.
Figure 3:
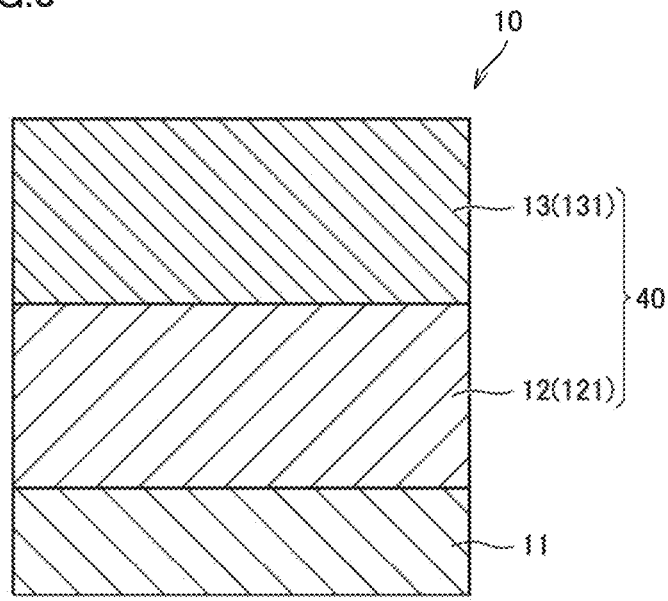
FIG. 3 is a schematic cross-sectional view showing a cutting tool in another aspect of the present embodiment.

As shown in FIG. 2 and FIG. 3, a cutting tool 10 of the present embodiment comprises a substrate 11 and a coating film 40 disposed on substrate 11; coating film 40 comprises a first layer 12 and a second layer 13; first layer 12 has a hardness $H_1$ of 25 GPa or more and 40 GPa or less; second layer 13 has a hardness $H_2$ satisfying $0.5 \times H_1 \leq H_2 \leq 0.9 \times H_1$; and at least one of a ratio $I_{(200)}/(I_{(200)}+I_{(111)}+I_{(220)})$ of $I_{(200)}$ of (200) plane to a sum of X-ray diffraction intensity $I_{(200)}$ of (200) plane, X-ray diffraction intensity $I_{(111)}$ of (111) plane, and X-ray diffraction intensity $I_{(220)}$ of (220) plane of the coating film, a ratio $I_{(111)}/(I_{(200)}+I_{(111)}+I_{(220)})$ of $I_{(111)}$ to the sum, and a ratio $I_{(220)}/(I_{(200)}+I_{(111)}+I_{(220)})$ of $I_{(220)}$ to the sum is 0.45 or more.

The cutting tool of the present disclosure can have a long tool life even in high-load cutting (especially high-load cutting such as intermittent machining) such as cutting of high-hardness materials such as hardened steel. The reason is presumed as follows.

(a) The coating film includes a first layer, and hardness $H_1$ of first layer 12 is 25 GPa or more and 40 GPa or less. Thereby, such cutting tools can have excellent abrasion resistance. Here, the term "abrasion resistance" means resistance to abrasion of the coating film when used for cutting.

(b) As described in (a), the coating film includes a first layer, and hardness $H_1$ of first layer 12 is 25 GPa or more and 40 GPa or less. A coating film having the hardness is excellent in abrasion resistance. However, since such a coating film is usually highly brittle, the coating film is easily damaged (chipping of the coating film and peeling of the coating film) due to destruction of the coating film itself. For this reason, in cutting tools having such a coating film, the coating film itself is destroyed during high-load cutting such as cutting of high-hardness materials such as hardened steel (especially high-load cutting such as intermittent machining) to cause damage, so that the wear tends to progress from the damage as starting point.

However, in the cutting tool of the present embodiment, the coating film has a second layer together with the first layer, and hardness $H_2$ of second layer 13 satisfies; $0.5 \times H_1 \leq H_2 \leq 0.9 \times H_1$, so that the brittleness of the coating film as a whole can be suppressed to a low level. As a result, damage caused by destruction of the coating film itself (fine cracks occurring in the coating film and peeling of the coating film) can be suppressed. For this reason, the cutting tool of the present embodiment has excellent peeling resistance and excellent chipping resistance even in high-load cutting such as cutting of high-hardness materials such as hardened steel (particularly, high-load cutting such as intermittent cutting), so that the progress of wear from a film damage as starting point can be suppressed. Here, the term "peeling resistance" means resistance to peeling of the coating film from the substrate. Also, the term "chipping resistance" means resistance to occurrence of minute cracks in the coating film.

(c) Further, in the cutting tool of the present embodiment, at least one of a ratio $I_{(200)}/(I_{(200)}+I_{(111)}+I_{(220)})$ of $I_{(200)}$ of (200) plane to a sum of X-ray diffraction intensity $I_{(200)}$ of (200) plane, X-ray diffraction intensity $I_{(111)}$ of (111) plane, and X-ray diffraction intensity $I_{(220)}$ of (220) plane of the coating film, a ratio $I_{(111)}/(I_{(200)}+I_{(111)}+I_{(220)})$ of $I_{(111)}$ to the sum, and a ratio $I_{(220)}/(I_{(200)}+I_{(111)}+I_{(220)})$ of $I_{(220)}$ to the sum is 0.45 or more. Thereby, variations in the orientation between the first layer and the second layer arranged nearest to the first layer can be suppressed to make uniform orientation, so that adhesion between the first layer and the second layer is improved. Thereby, the peeling resistance of such a cutting tool can be improved.

That is, the cutting tool according to the present embodiment can have a long tool life through combination of excellent abrasion resistance, excellent peeling resistance, and excellent chipping resistance.

The shape and application of cutting tool 10 according to the present embodiment are not particularly limited. Examples of cutting tool 10 of the present embodiment may include a drill, an end mill, an indexable cutting insert for drilling, an indexable cutting insert for end milling, an indexable cutting insert for milling, an indexable cutting insert for lathe turning, a metal saw, a gear cutting tool, a reamer, a tap, and a tip for pin milling of a crankshaft.

FIG. 1 is a perspective view showing an aspect of cutting tool 10 of the present disclosure. Cutting tool 10 in such a shape is used as an indexable cutting insert such as an indexable cutting insert for lathe turning.

Substrate

As the substrate of the present embodiment, a conventionally known substrate of this type may be used without any particular limitation. For example, the substrate preferably includes one selected from the group consisting of a cemented carbide (for example, a tungsten carbide (WC)-based cemented carbide, a cemented carbide containing Co in addition to WC, and a cemented carbide with addition of a carbonitride of Ti, Ta, Nb, etc., in addition to WC), a cermet (containing TiC, TiN, TiCN or the like as main component), a high-speed steel, a tool steel, ceramics (TiC, SiC, SiN, AlN, $Al_2O_3$, sialon, and mixture thereof), a polycrystalline cubic boron nitride sintered material (cBN sintered material), a diamond sintered material, and a hard material with polycrystalline cubic boron nitride particles dispersed in a binder phase.

Among these various substrates, a cemented carbide (particularly, WC-based cemented carbide) and a cermet (particularly, a TiCN-based cermet) are particularly preferably selected. The reason is that these substrates are excellent in balance between hardness and strength at high temperature, in particular, having suitability for a substrate of cutting tools for the use.

In the case where a cemented carbide is used as substrate, the cemented carbide exhibits the effect of the present embodiment even when containing free carbon or an abnormal phase referred to as η phase in the texture. The substrate for use of the present embodiment allows the surface to be a modified surface. For example, a cemented carbide may have a de-β layer formed on the surface, and a cBN sintered material may have a surface hardened layer. Even with such modification of the surface, the effect of the present embodiment may be exhibited.

In the case where the cutting tool is an indexable cutting insert (indexable cutting insert for lathe turning, an indexable cutting insert for milling, etc.), the substrate may include one having a tip breaker or one having no tip breaker. The shape of the cutting edge may include any one of a sharp edge (a ridge at which a rake face and a flank face cross), a honed shape (rounded sharp edge), a negative land (chamfered shape), and a combined shape of a honed shape and a negative land.

Coating Film

Coating film 40 is disposed on substrate 11 (FIG. 2 and FIG. 3). FIG. 2 is a schematic cross-sectional view showing an aspect of the cutting tool of the present disclosure. FIG. 3 is a schematic cross-sectional view showing another different aspect of the cutting tool of the present disclosure. "Coating film" covers at least the cutting edge of substrate 11, so that various properties such as peeling resistance, breakage resistance and abrasion resistance of a cutting tool are improved. The cutting edge described herein means a region within 500 μm from the cutting edge ridgeline along the substrate surface. It is preferable that coating film 40 cover whole the surface of substrate 11. However, the case where a part of substrate 11 is not covered with coating film 40, or the structure of coating film 40 is partly different is included within the scope of the present embodiment.

The thickness of the coating film is preferably 0.1 μm or more and 30 μm or less, more preferably 0.4 μm or more and 20 μm or less, still more preferably 0.5 μm or more and 10 μm or less, furthermore preferably 0.7 μm or more and 5 μm or less, and particularly preferably 1 μm or more and 3 μm or less. The thickness of the coating film means the sum total of the respective thicknesses of the layers that constitute the coating film. Examples of the "layers that constitute the coating film" include the first layer, the second layer, and another layer that is described as a layer other than the first layer and the second layer in the following.

The thickness of the coating film may be determined as follows. For example, the thicknesses are measured at five optional points of a cross-sectional sample in parallel with the normal direction of the surface of a substrate with a scanning electron microscope (SEM), and the average of the five measured thicknesses is determined as the thickness of the coating film. For the preparation of the cross-sectional samples a focused ion beam system, a cross section polisher, etc. may be used. The measurement of each of the thickness of the first layer, the second layer, the first unit layer, the second unit layer, the third unit layer, the fourth unit layer and the other layers is performed in the same manner.

The coating film includes a first layer and a second layer. In an aspect of the present embodiment, a plurality of the first layers may be disposed as long as the effect that the cutting tool exhibits is maintained. Also, a plurality of the second layers may be disposed as long as the effect that the cutting tool exhibits is maintained. Thereby, even when a part of the coating film is worn, the first layer and the second layer remain in the coating film, so that the cutting tool may retain the abrasion resistance, chipping resistance and peeling resistance of the coating film. Any one of the first layer and the second layer may be located nearest to the surface side. Also, any one of the first layer and the second layer may be located nearest to the substrate side. The expression "including the first layer and the second layer" means that the coating film may include another layer described in the following in addition to the first layer and the second layer.

Figure 9:
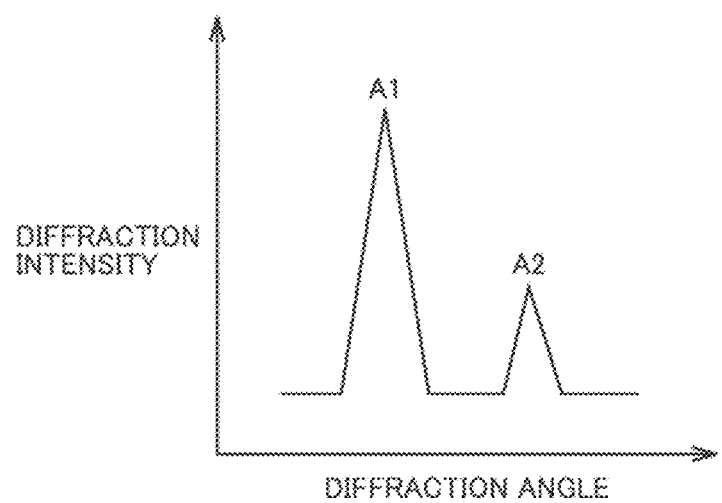
FIG. 9 is an image chart of a graph showing a result of X-ray diffraction measurement of a coating film.

At least one of a ratio $I_{(200)}/(I_{(200)}+I_{(111)}+I_{(220)})$ of $I_{(200)}$ of (200) plane to a sum of X-ray diffraction intensity $I_{(200)}$ of (200) plane, X-ray diffraction intensity $I_{(111)}$ of (111) plane, and X-ray diffraction intensity $I_{(220)}$ of (220) plane of the coating film, a ratio $I_{(111)}/(I_{(200)}+I_{(111)}+I_{(220)})$ of $I_{(111)}$ to the sum, and a ratio $I_{(220)}/(I_{(200)}+I_{(111)}+I_{(220)})$ of $I_{(220)}$ to the sum is 0.45 or more. Thereby, variations in the orientation between the first layer and the second layer arranged nearest to the first layer can be suppressed to make uniform orientation, so that adhesion between the first layer and the second layer is improved. Thereby, the peeling resistance of such a cutting tool can be improved. Here, "X-ray diffraction intensity $I_{(200)}$ of (200) plane" means the diffraction intensity (height of peak) of the highest peak among X-ray diffraction peaks derived from (200) plane (hereinafter, also referred to as "maximum diffraction intensity"). As shown in FIG. 9, in the case where two or more compounds contained in the coating film have an X-ray diffraction peak A1 derived from respective (200) plane, and an X-ray diffraction peak A2 derived from (200) plane, respectively, in other words, in the case where a plurality of X-ray diffraction peaks derived from respective (200) planes are present at different positions, "X-ray diffraction intensity $I_{(200)}$ of (200) plane" means the sum of the maximum diffraction intensity (height of peak). The same applies to "X-ray diffraction intensity $I_{(111)}$ of (111) plane", and "X-ray diffraction intensity $I_{(220)}$ of (220) plane".

At least one of $I_{(200)}/(I_{(200)}+I_{(111)}+I_{(220)})$, $I_{(111)}/(I_{(200)}+I_{(111)}+I_{(220)})$, and $I_{(220)}/(I_{(200)}+I_{(111)}+I_{(220)})$, is preferably 0.47 or more, more preferably 0.50 or more, and still more preferably 0.55 or more. At least one of $I_{(200)}/(I_{(200)}+I_{(111)}+I_{(220)})$, $I_{(111)}/(I_{(200)}+I_{(111)}+I_{(220)})$, and $I_{(220)}/(I_{(200)}+I_{(111)}+I_{(220)})$. is preferably 0.90 or less, more preferably 0.85 or less, and still more preferably 0.80 or less. At least one of $I_{(200)}/(I_{(200)}+I_{(111)}+(I_{(220)})$, $I_{(111)}/(I_{(200)}+I_{(111)}/(I_{(220)})$, and $I_{(220)}/(I_{(200)}+I_{(111)}+(I_{(220)})$, is preferably 0.47 or more and 0.90 or less, more preferably 0.50 or more and 0.85 or less, and still more preferably 0.55 or more and 0.80 or less.

$I_{(200)}$, $I_{(111)}$ and $I_{(220)}$ may be determined by X-ray diffraction measurement (XRD measurement), for example, under the following conditions. Specifically, $I_{(200)}$, $I_{(111)}$ and $I_{(220)}$ may be obtained by irradiating X-ray to the surface of the coating film to perform X-ray diffraction measurement (XRD measurement). The X-ray diffraction intensity of each of (200) plane, (111) plane and (220) plane is determined to calculate $I_{(200)}$, $I_{(111)}$ and $I_{(220)}$. Examples of the apparatus for use in X-ray diffraction measurement include "Smart-Lab" (trade name) manufactured by Rigaku Corporation and "X'pert" (trade name) manufactured by PANalytical.

Conditions for X-ray Diffraction Measurement

Scanning axis: 2θ-θ
X-ray source: Cu-Kα line (1.541862 angstrom)
Detector: zero-dimensional detector (scintillation counter)
Tube voltage: 45 KV
Tube current: 40 mA
Incidence optics: use of mirror
Photo detective optics: use of analyzer crystal (PW3098/27)
Step: 0.03°
Cumulative time: 2 seconds
Scanning range (2θ): 10° to 120°

It has been confirmed that the same measurement results are obtained at different measurement spots optionally selected in the same cutting tool of the present embodiment.

First Layer

Hardness of First Layer

The first layer of the present embodiment has a hardness $H_1$ of 25 GPa or more and 40 GPa or less. Thereby, the cutting tool can have excellent abrasion resistance. The lower limit of $H_1$ is preferably 27 GPa or more, more preferably 29 GPa or more, and still more preferably 31 GPa or more. The upper limit of $H_1$ is preferably 38 GPa or less, more preferably 36 GPa or less, and still more preferably 34 GPa or less. Further, H: is preferably 27 GPa or more and 38 GPa or less, more preferably 29 GPa or more and 36 GPa or less, and still more preferably 31 GPa or more and 34 GPa or less.

Hardness H; of the first layer is measured by a method in accordance with ISO14577 (2015) to measure the indentation hardness. A nanoindentation hardness tester (ENT1100a; manufactured by Elionix) is used as a measuring instrument.

Specifically, first, the cutting tool is ground at the position where provided with the coating film so as to obtain a surface (inclined surface) having an inclination of 6° with respect to the surface direction of the outermost surface of the coating film. Next, at an optional point on the resulting inclined surface of the first layer, corresponding to the middle point in the film thickness direction of the first layer, an indentation load controlled to have an indentation depth (h) of 1/10 or less of the film thickness of the first layer is applied under an environment at 25° C. to 30° C., so that measurement by the nanoindentation method is performed. By performing the measurements, hardness $H_1$ of the first layer is calculated in accordance with ISO14577. Hardness $H_2$ of the second layer is measured in the same manner. In the case where the first layer includes the first unit layer, the second unit layer, or the third unit layer, hardness $H_1$ of the first layer means the hardness of the entire first layer.

It has been confirmed that the same results can be obtained by optionally selecting a different measurement range of the same cutting tool and performing the measurements in the measurement range.

Thickness of First Layer

The first layer preferably has a thickness of 0.2 μm or more and 10 μm or less. Thereby, the abrasion resistance of the cutting tool may be further improved. The lower limit of the thickness of the first layer is preferably 0.4 μm or more, more preferably 0.5 μm or more, and still more preferably 0.6 μm or more. The upper limit of the thickness of the first layer is preferably 6 μm or less, more preferably 3 μm or less, and still more preferably 2 μm or less. Further, the thickness of the first layer is preferably 0.4 μm or more and 6 μm or less, more preferably 0.5 μm or more and 3 μm or less, and still more preferably 0.6 μm or more and 2 μm or less.

First Unit Layer

It is preferable that the first layer comprise a first unit layer, wherein the first unit layer is composed of $Ti_xAl_y$ $M_{1-x-y}C_zN_{1-z}$; M is one element selected from the group consisting of zirconium, hafnium, group V elements and group VI elements of the periodic table, silicon, boron, and yttrium; x is 0.20 or more and 0.99 or less, y is 0.01 or more and 0.80 or less, 1-x-y is 0.01 or more and 0.20 or less, and z is 0 or more and 1.0 or less. Thereby, the abrasion resistance of the cutting tool may be further improved. In the present specification, the expression "the first layer comprises a first unit layer" is a concept including an aspect in which the first layer consists of a first unit layer and an aspect in which the first layer comprises a second unit layer and a third unit layer to be described in the following together with the first unit layer. Also, the expression "the first unit layer is composed of $Ti_xAl_yM_{1-x-y}C_zN_{1-z}$" is a concept including not only an aspect in which the first unit layer is composed of $Ti_xAl_yM_{1-x-y}C_zN_{1-z}$ alone, but also an aspect in which the first unit layer comprises components other than $Ti_xAl_yM_{1-x-y}C_zN_{1-z}$ (for example, inevitable impurities) together with $Ti_xAl_yM_{1-x-y}C_zN_{1-z}$. as long as the effect of the present disclosure is exhibited.

Here, x is preferably 0.25 or more and 0.95 or less, more preferably 0.30 or more and 0.90 or less, and still more preferably 0.35 or more and 0.80 or less.

Here, y is preferably 0.10 or more and 0.70 or less, more preferably 0.20 or more and 0.60 or less, and still more preferably 0.30 or more and 0.55 or less.

Here, 1-x-y is preferably 0.02 or more and 0.18 or less, more preferably 0.03 or more and 0.15 or less, and still more preferably 0.04 or more and 0.10 or less.

Here, z is preferably 0.01 or more and 0.90 or less, more preferably 0.05 or more and 0.70 or less, and still more preferably 0.10 or more and 0.50 or less.

In the case where the first layer consists of the first unit layer, x may be 0.20 or more and 0.99 or less, y may be 0.01 or more and 0.80 or less, 1-x-y may be 0, and z may be 0 or more and 1.0 or less. In the case where the first layer includes a second unit layer and/or a third unit layer to be described as follows together with the first unit layer, 1-x-y is preferably not "0".

Here, x, y, and z may be checked by using an EDX (Energy Dispersive X-ray spectroscopy) apparatus attached to SEM or TEM. Specifically, first, a cutting tool is cut at an optional position in the film thickness direction to prepare a sample including a cross section of the coating film. Next, the first unit layer in the coating film is subjected to point analysis. The measurement point is on the middle point in the thickness direction of the first unit layer such that data near the interface are not included. The measurement is performed at five optionally selected points. At each of the five optional measurement points, x and y, which indicate the atomic ratio of each element, are specified. An average value of each of x and y at the five measurement points is determined. The average values correspond to x and y in the first unit layer. Note that m in the second unit layer described later, n in the third unit layer described later, and a, b, and c in the fourth unit layer described later are determined in the same manner.

In the case where the first layer consists of the first unit layer, the thickness of the first unit layer is preferably 0.2 μm or more and 10 μm or less. Thereby, the abrasion resistance of the cutting tool can be further improved. Also, in the case where the first layer consists of the first unit layer, the lower limit of the thickness of the first unit layer is preferably 0.4 μm or more, more preferably 0.5 μm or more, and still more preferably 0.6 μm or more. In the case where the first layer consists of the first unit layer, the upper limit of the thickness of the first unit layer is preferably 6 μm or less, more preferably 3 μm or less, and still more preferably 2 μm or less. In the case where the first layer consists of the first unit layer, the thickness of the first unit layer is preferably 0.4 μm or more and 6 μm or less, more preferably 0.5 μm or more and 3 μm or less, and still more preferably 0.6 μm or more and 2 μm or less.

In the case where the first layer includes the first unit layer and the second unit layer or the third unit layer, the thickness of the first unit layer is preferably 0.005 μm or more and 1 μm or less. Thereby, the abrasion resistance of the cutting tool can be further improved. In the case where the first layer includes the first unit layer and the second unit layer or the third unit layer, the lower limit of the thickness of the first unit layer is preferably 0.007 μm or more, more preferably 0.010 μm or more, and still more preferably 0.015 μm or more. In the case where the first layer includes the first unit layer and the second unit layer or the third unit layer, the upper limit of the thickness of the first unit layer is preferably 0.8 μm or less, more preferably 0.6 μm or less, and still more preferably 0.3 μm or less. In the case where the first layer includes the first unit layer and the second unit layer or the third unit layer, the thickness of the first unit layer is preferably 0.005 μm or more and 0.8 μm or less, more preferably 0.010 μm or more and 0.6 μm or less, and still more preferably 0.015 μm or more and 0.3 μm or less.

Second Unit Layer

Figure 4:
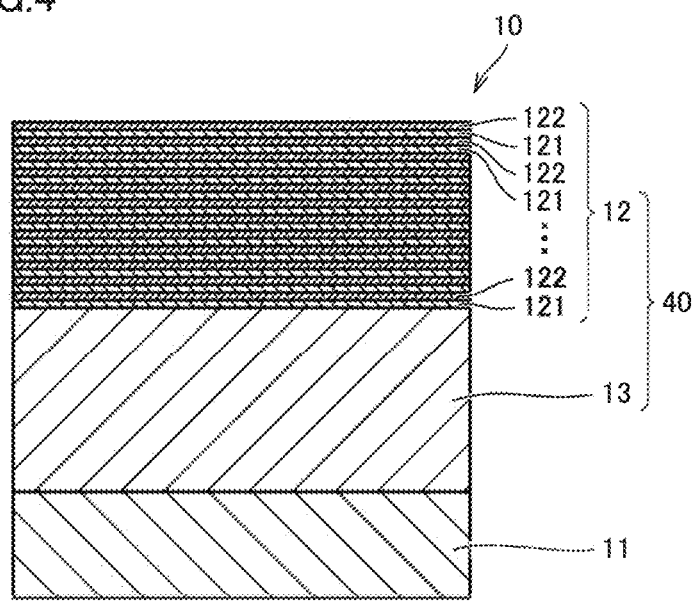
FIG. 4 is a schematic cross-sectional view showing a cutting tool in another different aspect of the present embodiment.

It is preferable that first layer 12 further include a second unit layer 13 together with the first unit layer. In this case, second unit layer 13 is composed of $Al_mCr_{1-m}N$. m is 0 or more and 0.8 or less, and the thickness of a first unit layer 121 is 5 nm or more and 50 nm or less, and the thickness of a second unit layer 122 is 5 nm or more and 50 nm or less. It is preferable that first unit layer 121 and second unit layer 122 be alternately laminated (FIG. 4). As a result, due to the fine grain size of the particles constituting the first layer, the hardness of the first layer increases, so that the abrasion resistance of the cutting tool may be further improved. Here, as long as "the first unit layer and the second unit layer are alternately laminated", any one of the first unit layer and the second unit layer may be disposed nearest to the substrate side, or any one of the first unit layer and the second unit layer may be disposed nearest to the surface side. Here, the expression "the second unit layer is composed of $Al_mCr_{1-m}N$" is a concept not limited to an aspect in which the second unit layer is composed of $Al_mCr_{1-m}N$ alone, but also includes an aspect in which the second unit layer includes components other than $Al_mCr_{1-m}N$ (for example, inevitable impurities) together with $Al_mCr_{1-m}N$, as long as the effect of the present disclosure is exhibited.

Further, m is preferably 0.10 or more and 0.75 or less, more preferably 0.20 or more and 0.73 or less, and still more preferably 0.30 or more and 0.70 or less.

The second unit layer preferably has a thickness of 5 nm or more and 1 μm or less. Thereby, the abrasion resistance of the cutting tool may be further improved. The lower limit of the thickness of the second unit layer is preferably 7 nm or more, more preferably 10 nm or more, and still more preferably 15 nm or more. The upper limit of the thickness of the second unit layer is preferably 0.8 μm or less, more preferably 0.6 μm or less, and still more preferably 0.3 μm or less. Further, the thickness of the second unit layer is preferably 5 nm or more and 0.8 μm or less, more preferably 10 nm or more and 0.6 µm or less, and still more preferably 15 nm or more and 0.3 µm or less.

Third Unit Layer

Figure 5:
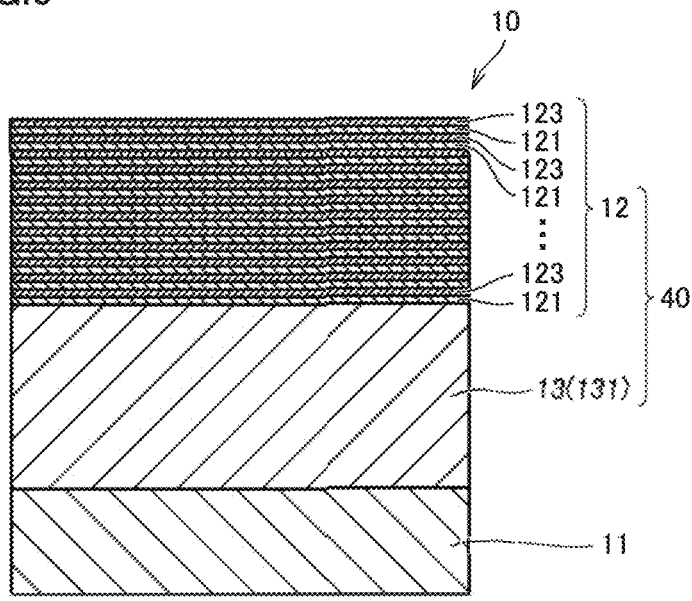
FIG. 5 is a schematic cross-sectional view showing a cutting tool in yet another different aspect of the present embodiment.

It is preferable that first layer 12 further include a third unit layer 123 together with the first unit layer. In this case, third unit layer 123 is composed of $Ti_{1-n}Al_nN$, wherein n is 0 or more and 0.8 or less, the thickness of first unit layer 121 is 5 nm or more and 50 nm or less, the thickness of third unit layer 123 is 5 nm or more and 50 nm or less. It is preferable that first unit layer 121 and third unit layer 123 be alternately laminated (FIG. 5). As a result, due to the fine grain size of the particles constituting the first layer of the cutting tool, the hardness of the first layer increases, so that the abrasion resistance of the cutting tool may be further improved. Here, as long as "the first unit layer and the third unit layer are alternately laminated", any one of the first unit layer and the third unit layer may be disposed nearest to the substrate side, or any one of the first unit layer and the third unit layer may be disposed nearest to the surface side. Here, the expression "the third unit layer is composed of $Ti_{1-n}Al_nN$" is a concept not limited to an aspect in which the third unit layer is composed of $Ti_{1-n}Al_nN$, but also includes an aspect in which the third unit layer includes components other than $Ti_{1-n}Al_nN$ (for example, inevitable impurities) together with $Ti_{1-n}Al_nN$, as long as the effect of the present disclosure is exhibited.

Further, n is preferably 0.3 or more and 0.9 or less, more preferably 0.4 or more and 0.8 or less, and still more preferably 0.5 or more and 0.7 or less.

The third unit layer preferably has a thickness of 5 nm or more and 1 µm or less. Thereby, the abrasion resistance of the cutting tool may be further improved. The lower limit of the thickness of the third unit layer is preferably 7 nm or more, more preferably 10 nm or more, and still more preferably 15 nm or more. The upper limit of the thickness of the third unit layer is preferably 0.8 µm or less, more preferably 0.6 um or less, and still more preferably 0.3 µm or less. Further, the thickness of the third unit layer is preferably 5 nm or more and 0.8 µm or less, more preferably 10 nm or more and 0.6 µm or less, and still more preferably 15 nm or more and 0.3 µm or less.

Second Layer

Hardness of Second Layer

The second layer of the present embodiment has a hardness $H_2$ which satisfies $0.5 \times H_1 \leq H_2 \leq 0.9 \times H_1$. Thereby, the cutting tool can have excellent peeling resistance and chipping resistance. Hardness $H_2$ preferably satisfies $H_2 > 0.53 \times H_1$, more preferably satisfies $H_2 \geq 0.56 \times H_1$, and still more preferably satisfies $H_2 \geq 0.6 \times H_1$. Further, hardness $H_2$ preferably satisfies $H_2 \leq 0.87 \times H_1$, more preferably satisfies $H_2 \leq 0.84 \times H_1$, and still more preferably satisfies $H_2 \leq 0.8 \times H_1$. Further, hardness $H_2$ preferably satisfies $0.53 \times H_1 \leq H_2 \leq 0.87 \times H_1$, more preferably satisfies $0.56 \times H_1 \leq H_2 \leq 0.84 \times H_1$, and still more preferably satisfies $0.6 \times H_1 \leq H_2 \leq 0.8 \times H_1$.

Thickness of Second Layer

The second layer preferably has a thickness of 0.2 µm or more and 10 µm or less. Thereby, the chipping resistance of the cutting tool and the peeling resistance of the cutting tool may be further improved. The lower limit of the thickness of the second layer is preferably 0.3 µm or more, more preferably 0.4 µm or more, and still more preferably 0.5 µm or more. The upper limit of the thickness of the second layer is preferably 8 µm or less, more preferably 5 µm or less, and still more preferably 3 µm or less. Further, the thickness of the second layer is preferably 0.3 µm or more and 8 um or less, more preferably 0.4 µm or more and 5 µm or less, and still more preferably 0.5 µm or more and 3 µm or less.

The ratio $T_1/T_2$ of thickness Ti of the first layer to thickness $T_2$ of the second layer is preferably 0.02 or more and 50 or less. Thereby, the balance among abrasion resistance, peeling resistance, and chipping resistance can be improved, so that the life of the cutting tool can be further improved. The lower limit of $T_1/T_2$ is preferably 0.04 or more, more preferably 0.06 or more, and still more preferably 0.1 or more. The upper limit of $T_1/T_2$ is preferably 45 or less, more preferably 40 or less, and still more preferably 30 or less.

Fourth Unit Layer

The second layer preferably comprises the fourth unit layer. In this case, the fourth unit layer is composed of $Ti_aAl_bC_cN_{1-c}$, wherein preferably a is 0.2 or more and 1.0 or less, b is 0 or more and 0.8 or less, and c is 0 or more and 1.0 or less. Thereby, the occurrence of cracks in the second layer can be effectively suppressed without deterioration of the adhesion between the first layer and the second layer, so that the chipping resistance of the cutting tool can be further improved. Further, thereby, the occurrence of chipping as the origin of peeling, and the occurrence of cracks as the origin of peeling in the second layer can be suppressed, so that the peeling resistance of the cutting tool can be further improved. Here, the expression "the second layer comprises the fourth unit layer" is a concept including an aspect in which the second layer consists of a fourth unit layer and an aspect in which the second layer comprises a layer other than the fourth unit layer together with the fourth unit layer. Here, the expression "the fourth unit layer is composed of $Ti_aAl_bC_cN_{1-c}$" is a concept including not only an aspect in which the fourth unit layer is composed of $Ti_aAl_bC_cN_{1-c}$ alone, but also an aspect in which the fourth unit layer comprises components other than $Ti_aAl_bC_cN_{1-c}$ together with $Ti_aAl_bC_cN_{1-c}$, as long as the effect of the present disclosure is exhibited.

The fourth unit layer preferably has a thickness of 0.3 µm or more and 9 µm or less. Thereby, the abrasion resistance of the cutting tool may be further improved. The lower limit of the thickness of the fourth unit layer is preferably 0.4 µm or more, more preferably 0.5 µm or more, and still more preferably 0.6 µm or more. The upper limit of the thickness of the fourth unit layer is preferably 7 µm or less, more preferably 5 µm or less, and still more preferably 3 µm or less. Further, the thickness of the fourth unit layer is preferably 0.4 µm or more and 7 µm or less, more preferably 0.5 µm or more and 5 µm or less, and still more preferably 0.6 µm or more and 3 µm or less.

Here, a is preferably 0.3 or more and 0.95 or less, more preferably 0.35 or more and 0.9 or less, and still more preferably 0.4 or more and 0.85 or less.

Here, b is preferably 0.05 or more and 0.7 or less, more preferably 0.1 or more and 0.65 or less, and still more preferably 0.15 or more and 0.6 or less.

Here, c is preferably 0.01 or more and 0.9 or less, more preferably 0.03 or more and 0.85 or less, and still more preferably 0.05 or more and 0.7 or less.

Other Layers

Figure 6:
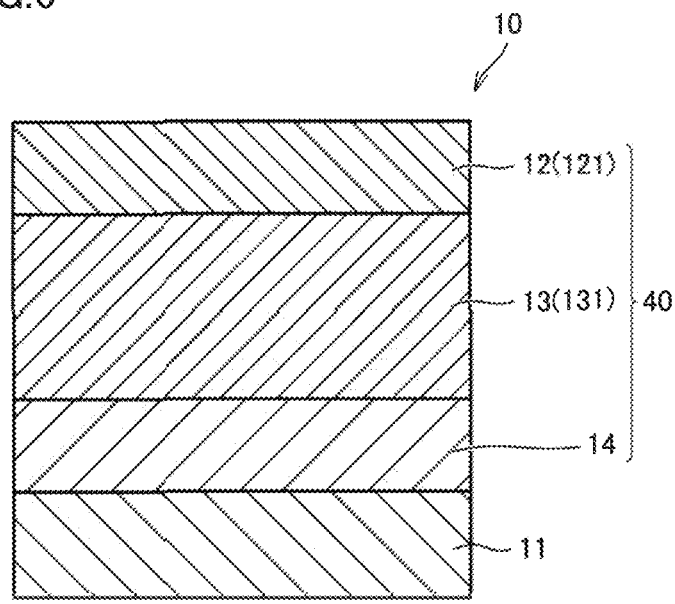
FIG. 6 is a schematic cross-sectional view of a cutting tool having a coating film comprising a foundation layer in the present embodiment.
Figure 7:
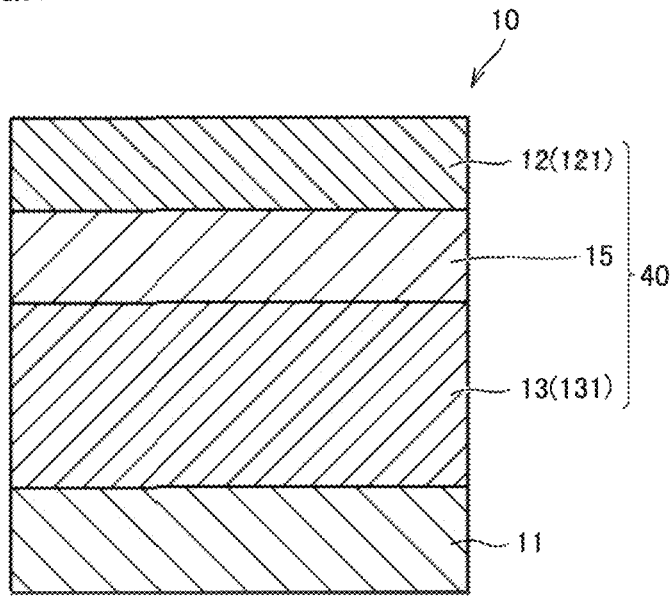
FIG. 7 is a schematic cross-sectional view of a cutting tool having a coating film comprising an intermediate layer in the present embodiment.
Figure 8:
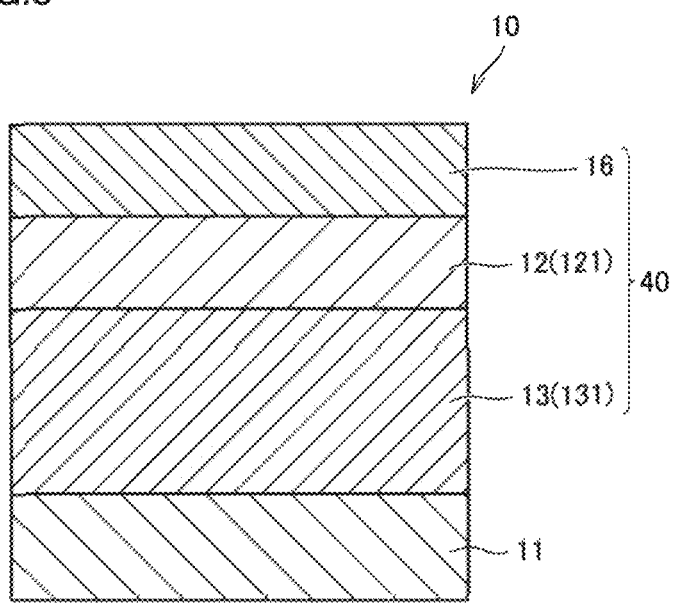
FIG. 8 is a schematic cross-sectional view of a cutting tool having a coating film comprising a surface layer in the present embodiment.

The coating film may further include other layers as long as the effects of the present embodiment are not impaired. As shown in FIGS. 6 to 8, examples of the other layers include a foundation layer 14, an intermediate layer 15, and a surface layer 16.

Foundation Layer

The coating film of the present embodiment may include a foundation layer. Foundation layer 14 is a layer disposed between substrate 11 and any one of first layer 12 and second layer 13 disposed nearest to the substrate side. The foundation layer is composed of a first compound, and the first compound is preferably composed of one or more elements selected from the group consisting of group IV elements, group V elements and group VI elements of the periodic table and aluminum, and one or more elements selected from the group consisting of carbon, nitrogen, and boron and oxygen. Thereby, the abrasion resistance of the cutting tool can be further improved. Further, thereby the adhesion between the coating film and the substrate can be also improved. Through arrangement of a TiN layer, a TiC layer, a TiCN layer, a TiBN layer, an AlCrN layer, or a TiAlN layer directly above the substrate as the foundation layer, the adhesion between the substrate and the coating film can be enhanced. The thickness of the foundation layer is preferably 0.1 μm or more and 20 μm or less. Thereby, the abrasion resistance of the cutting tool can be further improved. Thereby, the cutting tool can also have excellent breakage resistance.

Intermediate Layer

The coating film of the present embodiment may include an intermediate layer. An intermediate layer 15 is a layer disposed between first layer 12 and second layer 13. It is preferable that the composition of the intermediate layer be, for example, a TiAlN layer or a TiN layer. It is preferable that the thickness of the intermediate layer be 0.01 μm or more and 0.2 μm or less.

Surface Layer

The coating film of the present embodiment may include a surface layer. A surface layer 16 is a layer disposed nearest to the surface side in a coating film 40. However, the surface layer may not be formed at the cutting edge ridgeline. Surface layer 16 is composed of a second compound, and the second compound is preferably composed of one or more elements selected from the group consisting of group IV elements, group V elements and group VI elements of the periodic table and aluminum, and one or more elements selected from the group consisting of carbon, nitrogen, and boron and oxygen. Thereby, the abrasion resistance of the cutting tool can be further improved.

Examples of surface layer 16 include a TiN layer and a TiAlN layer. Since the TiN layer has a distinct color (exhibiting golden color), when used as surface layer 16, identification of the corner of a cutting insert after use for cutting (identification of used portion) is advantageously easy. Use of the TiAlN layer as surface layer 16 allows the oxidation resistance of the coating film to be enhanced.

It is preferable that the thickness of surface layer 16 be 0.05 μm or more and 1 μm or less. Thereby, the adhesion between surface layer 16 and a neighboring layer is enhanced.

Embodiment 2: Method for Manufacturing Cutting Tool

A method for manufacturing the cutting tool of embodiment 1 is described as follows. The following production method is an example, and the cutting tool in embodiment 1 may be produced by another method.

A method for manufacturing the cutting tool of the present embodiment includes:
 a first step of preparing the substrate (hereinafter, also referred to simply as "first step"), and
 a second step of forming the coating film on the substrate (hereinafter, also referred to simply as "second step"). Each of the steps are described as follows.

First Step: Preparing Substrate

In the first step, the substrate is prepared. As the substrate, any substrate may be used as long as it is conventionally known as the substrate of this type. For example, a tool having a shape according to ISO standard DNGA150408, made of cubic boron nitride sintered material, may be used.

Second Step: Forming Coating Film on Substrate

In the second step, a coating film is formed on the substrate. The second step includes "covering with first layer" for covering at least a part of the surface of the substrate and "covering with second layer" for covering at least a part of the surface of the substrate. As long as covering with first layer and covering with second layer are performed, any one of covering with first layer and covering with second layer may be performed first. Further, the second step may further include at least any one of step (i), step (ii), and step (iii), which will be described later. In addition, the second step may further include "covering with another layer" of covering at least a part of the surface of the substrate with the other layer.

In covering with first layer and covering with second layer, at least the cutting edge portion of the surface of the substrate is covered with the first layer or the second layer. Further, the term "covering with the first layer" or "covering with the second layer" refers to a concept including both of the case where the substrate surface is covered with the first layer or the second layer directly on the surface, and the case where a layer (foundation layer) other than the first layer or the second layer is disposed between the substrate surface and the first layer or the second layer. Any one of covering with first layer and covering with second layer may be performed first.

Covering with first layer may include a "step of covering with first unit layer" for forming a first unit layer in the first layer. Covering with first layer may further include a "step of covering with second unit layer" for forming a second unit layer in the first layer, or a "step of covering with third unit layer" for forming a third unit layer in the first layer. Covering with second layer may include a "step of covering with fourth unit layer" for forming a fourth unit layer in the second layer. The second step may include a "step of covering with another layer" for forming the other layer.

Examples of the method for covering at least a part of the surface of the substrate with the first layer include a physical vapor deposition (PVD) method. The same applies to the step of covering with first unit layer, the step of covering with second unit layer, the step of covering with third unit layer, covering with second layer, and the step of covering with fourth unit layer.

Examples of the physical vapor deposition method include sputtering, ion plating, arc ion plating method, and electron ion beam vapor deposition. In particular. use of cathode arc ion plating method having high ionization rate of a raw material element or sputtering is preferred, allowing the substrate surface to be subjected to metal or gas ion bombardment before forming the coating film, so that the adhesion between the coating film and the substrate is remarkedly improved.

Examples of the conditions for forming a coating film by arc ion plating method include the following. For example, in the case where a layer composed of TiN is formed, a Ti target is used as metal evaporation source, and $N_2$ gas is used as reaction gas. The basal plate (substrate) temperature is set at 400 to 550° C. and the gas pressure in the apparatus is set at 0.3 to 1.5 Pa.

While maintaining the basal plate (negative) bias voltage at 10 to 150 V with DC or pulse DC (frequency: 20 to 50 KHz), an arc current of 80 to 150 A is supplied to the cathode electrode to generate metal ions etc. from an arc-type evaporation source, so that a layer composed of TiN can be formed. A tungsten filament is also discharged during film formation (emission current: 30 to 45 A). Thereby, ions in the plasma can be increased. Examples of the apparatus used for arc ion plating method includes AIP (trade name) manufactured by Kobe Steel, Ltd.

Examples of the conditions for forming a coating film by sputtering include the following. In the case where a layer composed of TiN is formed, a Ti target can be used as metal evaporation source, and a sputtering gas such as $N_2$ gas, Ar gas, Kr gas, and Xe gas can be used as reaction gas.

As a result of intensive study, the present inventors have newly found that the difference in hardness between the first layer and the second layer can be adjusted by performing at least one of the following steps (i) to (iii). In particular, even in the case where the difference in hardness between the first layer and the second layer is out of a desired range under conventional film formation conditions in terms of chemical composition, the difference in hardness between the first layer and the second layer can be easily adjusted by performing at least one of steps (i) to (iii).

In step (i), the second layer is annealed with a heater for a certain period of time. As a result, the hardness of the second layer can be lowered, so that hardness $H_2$ of the second layer can be adjusted within the range of $0.5 \times H_1 \leq H_2 \leq 0.9 \times H_1$. The rate of temperature increase in step (i) is, for example, 5° C./min or more and 10° C./min or less. Further, the annealing temperature in step (i) is, for example, 400° C. or more and 500° C. or less. Also, the annealing time in step (i) is, for example, 10 minutes or more and 60 minutes or less. Further, the cooling rate in step (i) is, for example, 5° C./min or more and 10° C./min or less. Further, the pressure in the furnace during cooling in step (i) is, for example, 1 Pa or more and 8 Pa or less.

In step (ii), the first layer or the second layer is subjected to ion bombardment using a sputtering gas. Thereby, compressive stress can be imparted to the first layer or the second laver, so that the hardness of the first layer or the second layer treated with the ion bombardment can be increased. The gas composition in step (ii) is, for example, Ar (100%), Kr (100%), or Xe (100%). Further, the gas pressure in step (ii) is, for example, 1 Pa or more and 3 Pa or less. Further, the bias voltage in step (ii) is, for example, −1000 V or more and −600 V or less. Further, the treatment time in step (ii) is, for example, 5 minutes or more and 60 minutes or less.

In step (iii), the first unit layer and the second unit layer or the third unit layer are alternately laminated. Thereby, lattice constant distortion occurs between layers having different compositions, so that the hardness of the first layer can be adjusted.

As a result of extensive studies, the present inventors have newly found that the adhesion between the first layer and the second layer can be improved by performing the following step (iv).

In step (iv), the bias voltage is adjusted as follows when covering with second layer and covering with first layer are switched.

A case where covering with second layer is performed first and then covering with first layer is performed will be described. The bias voltage in covering with second layer is expressed as A (V) and the bias voltage in covering with first layer is expressed as B (V). First, with the bias voltage set to A (V), covering with second layer is performed. When the thickness of the second layer reaches a desired thickness, while maintaining the film formation conditions other than the bias voltage, the bias voltage is changed to more than A and less than B (V) when B>A, or changed to more than B and less than A (V) when A>B so as to perform film formation for 60 to 120 seconds. This step is represented as a step (iv-1). Subsequently, the film formation conditions other than the bias voltage are changed to conditions for covering with first layer, with the bias voltage maintained in step (iv-1), so as to perform film formation for 60 to 120 seconds. This step is represented as a step (iv-2).

Subsequently, while maintaining the film formation conditions other than the bias voltage, the bias voltage is changed to B (V) so as to perform covering with first layer. In this case, step (iv) includes one or both of step (iv-1) and step (iv-2).

A case where covering with first layer is performed first and then covering with second layer is performed will be described. The bias voltage in covering with first layer is expressed as B (V) and the bias voltage in covering with second layer is expressed as A (V). First, with the bias voltage set to B (V), covering with first layer is performed. When the thickness of the first layer reaches a desired thickness, while maintaining the film formation conditions other than the bias voltage, the bias voltage is changed to more than A and less than B (V) when B>A, or changed to more than B and less than A (V) when A>B so as to perform film formation for 60 to 120 seconds. This step is represented as a step (iv-3). Subsequently, the film formation conditions other than the bias voltage are changed to the conditions for covering with second layer, with the bias voltage maintained in step (iv-3), so as to perform film formation for 60 to 120 seconds. This step is represented as a step (iv-4). Subsequently, while maintaining the film formation conditions other than the bias voltage, the bias voltage is changed to A (V) so as to perform covering with second layer. In this case, step (iv) includes one or both of step (iv-3) and step (iv-4).

Note that, in the case where bias voltage B (V) in the step of covering with first layer is not in the range of more than 20 V and less than 60 V, a desired hardness $H_1$ tends to be hardly obtained.

According to step (iv), changes in the bias voltage when switching from covering with first layer to covering with second layer and when switching from covering with second layer to covering with first layer can be moderated, so that variations in orientation in the coating film caused by abrupt changes in the bias voltage during film formation can be suppressed. As a result, among orientations becomes dominant, so that at least any one of $I_{(200)}/(I_{(200)}+I_{(111)}+I_{(220)})$, $I_{(111)}/(I_{(200)}+I_{(111)}+I_{(220)})$, and $I_{(220)}/(I_{(200)}+I_{(111)}+I_{(220)})$ may be 0.45 or more. As a result of extensive studies, the present inventors have newly found that the variation in orientation in the coating film can be suppressed by switching the bias voltage as described above.

Covering with Other Layer

In the second step according to the present embodiment, in addition to covering with first layer, covering with second layer, and the annealing step, "covering with foundation layer" for forming a foundation layer between the substrate and the first layer, "covering with intermediate layer" for forming an intermediate layer between the first layer and the second layer, "covering with surface layer" for forming a surface layer on the second layer, etc. may be appropriately performed. In the case where other layers such as the foundation layer, the intermediate layer, the surface layer, etc. are formed, the other layers may be formed by conventional methods. Specifically. for example, the other layers may be formed by PVD method described above.

Other Steps

In the manufacturing method according to the present embodiment, in addition to the steps described above, for example, a surface treatment step may be appropriately performed. Examples of the surface treatment step include surface treatment using a medium in which diamond powder is supported on an elastic material.

EXAMPLES

The present invention is described in more details with reference to Examples, though the present invention is not limited thereto.

Example 1

Preparation of Cutting Tool

Samples No. 1-1 to No. 1-15, Samples No. 1-17 to No. 1-34, and Samples No. 1-101 to No. 1-106

By the following production method, cutting tools of samples No. 1-1 to No. 1-15, samples No. 1-17 to No. 1-34, and samples No. 1-101 to No. 1-106 were prepared.

Step of Preparing Substrate

First, as substrate preparation step, a tool made of cubic boron nitride sintered material (shape: JIS standard DNGA150408) was prepared as a substrate. Subsequently, the substrate was set at a predetermined position of an arc ion plating apparatus (manufactured by Kobe Steel, Ltd., trade name: AIP).

Step of Forming Coating Film on Substrate

Next, as step of covering with second layer, a second layer was formed on the surface of the substrate using an arc ion plating method under the conditions described in Table 1. Specifically, the following method was used. As the metal evaporation source, a target corresponding to the "composition" of the second layer described in the following Tables 3 and 4 was used. For example, in the case where the composition of the second layer was TiAlN, a TiAl target was used as the metal evaporation source. In the case of TiCN, TiC or TiN, a Ti target was used as the metal evaporation source. $N_2$ gas and/or methane gas was used as the reaction gas. The basal plate (substrate) temperature was set at 500° C. and the gas pressure in the apparatus was set at 1 Pa.

Next, as step (i), the surface of the second layer was annealed under the conditions described in the column "Annealing Temperature [° C.]/Time [minutes]" in Table 1. The furnace pressure during annealing was set to 2 Pa. In Table 1, "-" in the column "Annealing Temperature [° C.]/Time [minutes]" means that step (i) was not performed.

Next, as step (ii), ion bombardment was performed under the conditions described in the column "Ion bombardment" in Table 1. Here, "Ar (800 V)" means that the reaction gas was Ar gas and the bias voltage was 800 V. The ion bombardment time was 45 minutes, and the furnace pressure was 1 Pa. In Table 1, "-" in the column "Ion bombardment" means that step (ii) was not performed.

Next, as step (iv), while maintaining the conditions other than the bias voltage, the bias voltage was changed from the bias voltage value in covering with second layer to the bias voltage value described in the column "Step (iv)" in Table 1 so as to perform film formation for 60 seconds. For example, in sample 1-1, the bias voltage was changed from 30 V (bias voltage in covering with second layer) to 33 V (bias voltage in step (iv)). Subsequently, the film formation conditions other than the bias voltage were changed to the following conditions for covering with first layer, and film formation was performed for 60 seconds while maintaining the bias voltage.

Next, as covering with first layer, using arc ion plating method under the conditions described in Table 1, the first layer was formed on the second layer. Specifically, the following method was used. As the metal evaporation source, a target corresponding to the "composition" of the first layer described in the following Tables 3 and 4 was used. For example, in the case where the composition of the first layer was TiAlN, a TiAl target was used as the metal evaporation source. Also, in the case where the composition of the first layer was TiAlSiN, a TiAlSi target was used as the metal evaporation source. $N_2$ gas was used as the reaction gas. The basal plate (substrate) temperature was set at 500° C. and the gas pressure in the apparatus was set at 4 Pa.

TABLE 1

| Sample No. | Covering with second layer Bias voltage [V] | Step(i) Annealing Temperature [° C.]/Time [min] | Step(ii) Ion bombardment | Step(iv) Bias voltage [V] | Covering with first layer Bias voltage [V] |
|---|---|---|---|---|---|
| 1-1 | 30 | — | — | 33 | 35 |
| 1-2 | 32 | 500/30 | — | 33 | 35 |
| 1-3 | 32 | — | Ar (−800 V) | 33 | 35 |
| 1-4 | 25 | — | — | 33 | 35 |
| 1-5 | 30 | 500/30 | — | 33 | 35 |
| 1-6 | 30 | — | Ar (−800 V) | 33 | 35 |
| 1-7 | 30 | — | — | 33 | 35 |
| 1-8 | 30 | — | — | 33 | 35 |
| 1-9 | 30 | — | — | 33 | 35 |
| 1-10 | 30 | — | — | 33 | 35 |
| 1-11 | 25 | 500/30 | — | 33 | 35 |
| 1-12 | 30 | 500/30 | — | 33 | 35 |
| 1-13 | 32 | 500/30 | — | 33 | 35 |
| 1-14 | 20 | 500/60 | — | 21 | 23 |
| 1-15 | 30 | — | — | 40 | 50 |
| 1-17 | 60 | 500/60 | — | 38 | 35 |
| 1-18 | 60 | 500/60 | — | 38 | 35 |
| 1-19 | 60 | 500/60 | — | 38 | 35 |
| 1-20 | 100 | 500/60 | — | 55 | 50 |

TABLE 1-continued

| Sample No. | Covering with second layer Bias voltage [V] | Step(i) Annealing Temperature [° C.]/Time [min] | Step(ii) Ion bombardment | Step(iv) Bias voltage [V] | Covering with first layer Bias voltage [V] |
|---|---|---|---|---|---|
| 1-21 | 30 | — | — | 33 | 35 |
| 1-22 | 30 | — | — | 33 | 35 |
| 1-23 | 30 | — | — | 33 | 35 |
| 1-24 | 30 | — | — | 33 | 35 |
| 1-25 | 30 | — | — | 33 | 35 |
| 1-26 | 30 | — | — | 33 | 35 |
| 1-27 | 30 | — | — | 33 | 35 |
| 1-28 | 30 | — | — | 33 | 35 |
| 1-29 | 30 | — | — | 33 | 35 |
| 1-30 | 30 | — | — | 33 | 35 |
| 1-31 | 30 | — | — | 33 | 35 |
| 1-32 | 30 | — | — | 33 | 35 |
| 1-33 | 30 | — | — | 33 | 35 |
| 1-34 | 30 | — | — | 33 | 35 |
| 1-101 | 35 | — | — | — | 35 |
| 1-102 | 33 | — | — | — | 35 |
| 1-103 | 15 | — | — | — | 35 |
| 1-104 | 15 | 500/60 | — | 18 | 20 |
| 1-105 | 30 | — | — | 50 | 60 |
| 1-106 | 20 | — | — | — | 25 |

Sample No. 1-16

A cutting tool of sample No. 1-16 was prepared using the following production method.

Step of Preparing Substrate

As a substrate preparation step, the same substrate as that of sample No. 1-1 was prepared and set at a predetermined position in an arc ion plating apparatus.

Step of Forming Coating Film on Substrate

Next, as covering with first layer, under the conditions described in Table 2, an arc ion plating method was used to form a first layer on the substrate. Specifically, the following method was used. As the metal evaporation source, a target corresponding to the "composition" of the first layer described in the following Tables 3 was used. In other words, a TiAl target was used as the metal evaporation source. $N_2$ gas was used as the reaction gas. The basal plate (substrate) temperature was set at 500° C. and the gas pressure in the apparatus was set at 2 Pa.

Next, as step (iv), while maintaining the conditions other than the bias voltage, the bias voltage was changed from the bias voltage value in covering with first layer to the bias voltage value described in the column "Step (iv)" in Table 2. Subsequently, the film formation conditions other than the bias voltage were changed to the following conditions for covering with second layer, and film formation was performed for 60 seconds while maintaining the bias voltage.

Next, as covering with second layer, using arc ion plating method under the conditions described in Table 2, the second layer was formed on the first layer. Specifically, the following method was used. As the metal evaporation source, a target corresponding to the "composition" of the second layer described in the following Tables 3 and 4 was used. In other words, a TiAl target was used as the metal evaporation source. $N_2$ gas was used as the reaction gas. The basal plate (substrate) temperature was set at 500° C. and the gas pressure in the apparatus was set at 2 Pa.

Note that, steps (i) and (ii) were not performed to make the cutting tool of sample No. 1-16.

TABLE 2

| Sample No. | Covering with first layer Bias voltage [V] | Step(iv) Bias voltage [V] | Covering with second layer Bias voltage [V] | Step(i) Annealing Temperature [° C.]/Time [min] | Step(ii) Ion bombardment |
|---|---|---|---|---|---|
| 1-16 | 35 | 33 | 30 | — | — |

Characterization of Cutting Tool

Respective properties of cutting tools of samples No. 1-1 to No. 1-34 and samples No. 1-101 to No. 1-106 thus prepared were evaluated as follows. Cutting tools of samples No. 1-1 to No. 1-34 correspond to Examples, and cutting tools of samples No. 1-101 to No. 1-106 correspond to Comparative Examples.

Measurement of x, y, z, a, b and c

With regard to the cutting tools of samples No. 1-1 to No. 1-34, and samples No. 1-101 to No. 1-106, "x", "y" and "z" in the composition of the first layer $Ti_xAl_yM_{1-x-y}C_zN_{1-z}$ and "a", "b" and "c" in the composition of the second layer $Ti_aAl_bC_cN_{1-c}$ were determined by the method described in embodiment 1. The results obtained are described as atomic ratios in the chemical formulas in item "Composition" in Tables 3 and 4, respectively.

TABLE 3

| | | First layer | | | | | Second layer | | | | | | | Cutting evaluation Maximum amount of wear [μm] |
|---|---|---|---|---|---|---|---|---|---|---|---|---|---|---|
| Sample No. | Composition | Substrate side/ Surface side | Thickness $T_1$ [μm] | Hardness $H_1$ [GPa] | $0.5 \times H_1$ | $0.9 \times H_1$ | Composition | Substrate side/ Surface side | Thickness $T_2$ [μm] | Hardness $H_2$ [GPa] | $T_1/T_2$ | $R_{(200)}$ | $R_{(111)}$ | $R_{(220)}$ | |
| 1-1 | $Ti_{0.50}Al_{0.50}N$ | Surface side | 1.0 | 30 | 15.0 | 27.0 | $Ti_{0.5}Al_{0.5}N$ | Substrate side | 1.0 | 24 | 1.00 | 0.88 | 0.05 | 0.07 | 271 |
| 1-2 | $Ti_{0.50}Al_{0.50}N$ | Surface side | 1.0 | 30 | 15.0 | 27.0 | $Ti_{0.5}Al_{0.5}N$ | Substrate side | 1.0 | 26 | 1.00 | 0.87 | 0.04 | 0.09 | 271 |
| 1-3 | $Ti_{0.50}Al_{0.50}N$ | Surface side | 1.0 | 30 | 15.0 | 27.0 | $Ti_{0.5}Al_{0.5}N$ | Substrate side | 1.0 | 27 | 1.00 | 0.88 | 0.05 | 0.07 | 281 |

TABLE 3-continued

| | First layer | | | | | Second layer | | | | | | | | Cutting evaluation Maximum amount of wear [μm] |
|---|---|---|---|---|---|---|---|---|---|---|---|---|---|---|
| Sample No. | Composition | Substrate side/ Surface side | Thickness $T_1$ [μm] | Hardness $H_1$ [GPa] | $0.5 \times H_1$ | $0.9 \times H_1$ | Composition | Substrate side/ Surface side | Thickness $T_2$ [μm] | Hardness $H_2$ [GPa] | $T_1/T_2$ | $R_{(200)}$ | $R_{(111)}$ | $R_{(220)}$ | |
| 1-4 | $Ti_{0.50}Al_{0.50}N$ | Surface side | 1.0 | 30 | 15.0 | 27.0 | $Ti_{0.5}Al_{0.5}N$ | Substrate side | 1.0 | 22 | 1.00 | 0.87 | 0.05 | 0.08 | 279 |
| 1-5 | $Ti_{0.50}Al_{0.50}N$ | Surface side | 1.0 | 30 | 15.0 | 27.0 | $Ti_{0.5}Al_{0.5}N$ | Substrate side | 1.0 | 23 | 1.00 | 0.89 | 0.04 | 0 07 | 276 |
| 1-6 | $Ti_{0.50}Al_{0.50}N$ | Surface side | 1.0 | 30 | 15.0 | 27.0 | $Ti_{0.5}Al_{0.5}N$ | Substrate side | 1.0 | 25 | 1.00 | 0.88 | 0.03 | 0.09 | 279 |
| 1-7 | $Ti_{0.50}Al_{0.50}N$ | Surface side | 11.0 | 30 | 15.0 | 27.0 | $Ti_{0.5}Al_{0.5}N$ | Substrate side | 0.1 | 24 | 110.00 | 0.89 | 0.05 | 0.06 | 275 |
| 1-8 | $Ti_{0.50}Al_{0.50}N$ | Surface side | 0.1 | 30 | 15.0 | 27.0 | $Ti_{0.5}Al_{0.5}N$ | Substrate side | 11.0 | 24 | 0.01 | 0.87 | 0.04 | 0 09 | 274 |
| 1-9 | $Ti_{0.50}Al_{0.50}N$ | Surface side | 0.1 | 30 | 15.0 | 27.0 | $Ti_{0.5}Al_{0.5}N$ | Substrate side | 1.0 | 24 | 0.10 | 0.89 | 0.05 | 0.06 | 279 |
| 1-10 | $Ti_{0.50}Al_{0.50}N$ | Surface side | 10.0 | 30 | 15.0 | 27.0 | $Ti_{0.5}Al_{0.5}N$ | Substrate side | 1.0 | 24 | 10.00 | 0.88 | 0.04 | 0.08 | 280 |
| 1-11 | $Ti_{0.50}Al_{0.50}N$ | Surface side | 1.0 | 30 | 15.0 | 27.0 | TiN | Substrate side | 1.0 | 15 | 1.00 | 0.89 | 0.05 | 0 06 | 282 |
| 1-12 | $Ti_{0.40}Al_{0.60}N$ | Surface side | 1.0 | 32 | 16.0 | 28.8 | $Ti_{0.4}Al_{0.6}N$ | Substrate side | 1.0 | 26 | 1.00 | 0.87 | 0.05 | 0.08 | 271 |
| 1-13 | $Ti_{0.40}Al_{0.60}N$ | Surface side | 1.0 | 32 | 16.0 | 28.8 | $Ti_{0.5}Al_{0.5}N$ | Substrate side | 1.0 | 26 | 1.00 | 0.80 | 0.10 | 0.10 | 275 |
| 1-14 | $Ti_{0.50}Al_{0.50}N$ | Surface side | 1.0 | 25 | 12.5 | 22.5 | $Ti_{0.5}Al_{0.5}N$ | Substrate side | 1.0 | 22 | 1.00 | 0.88 | 0.05 | 0.07 | 289 |
| 1-15 | $Ti_{0.50}Al_{0.50}N$ | Surface side | 1.0 | 40 | 20.0 | 36.0 | $Ti_{0.5}Al_{0.5}N$ | Substrate side | 1.0 | 27 | 1.00 | 0.88 | 0.05 | 0.07 | 286 |
| 1-16 | $Ti_{0.50}Al_{0.50}N$ | Substrate side | 1.0 | 30 | 15.0 | 27.0 | $Ti_{0.5}Al_{0.5}N$ | Surface side | 1.0 | 24 | 1.00 | 0.90 | 0.05 | 0.05 | 274 |
| 1-17 | $Ti_{0.50}Al_{0.50}N$ | Surface side | 0.2 | 30 | 15.0 | 27.0 | $Ti_{0.5}Al_{0.5}N$ | Substrate side | 10.0 | 27 | 0.02 | 0.89 | 0.05 | 0.06 | 289 |
| 1-18 | $Ti_{0.50}Al_{0.50}N$ | Surface side | 10.0 | 30 | 15.0 | 27.0 | $Ti_{0.5}Al_{0.5}N$ | Substrate side | 0.2 | 27 | 50.00 | 0.89 | 0.05 | 0.06 | 283 |
| 1-19 | $Ti_{0.99}Al_{0.01}N$ | Surface side | 0.1 | 30 | 15.0 | 27.0 | $Ti_{0.5}Al_{0.5}N$ | Substrate side | 10.0 | 27 | 0.01 | 0.87 | 0.04 | 0.09 | 288 |
| 1-20 | $Ti_{0.20}Al_{0.80}N$ | Surface side | 1.0 | 31 | 15.5 | 27.9 | $Ti_{0.5}Al_{0.5}N$ | Substrate side | 1.0 | 27 | 1.00 | 0.43 | 0.45 | 0.12 | 290 |
| 1-21 | $Ti_{0.20}Al_{0.79}Si_{0.01}N$ | Surface side | 1.0 | 30 | 15.0 | 27.0 | $Ti_{0.5}Al_{0.5}N$ | Substrate side | 1.0 | 24 | 1.00 | 0.89 | 0.04 | 0.07 | 282 |
| 1-22 | $Ti_{0.98}Al_{0.01}B_{0.01}N$ | Surface side | 1.0 | 30 | 15.0 | 27.0 | $Ti_{0.5}Al_{0.5}N$ | Substrate side | 1.0 | 24 | 1.00 | 0.84 | 0.03 | 0.13 | 280 |
| 1-23 | $Ti_{0.50}Al_{0.30}Y_{0.20}N$ | Surface side | 1.0 | 30 | 15.0 | 27.0 | $Ti_{0.5}Al_{0.5}N$ | Substrate side | 1.0 | 24 | 1.00 | 0.84 | 0.04 | 0.12 | 281 |
| 1-24 | $Ti_{0.49}Al_{0.49}Zr_{0.01}N$ | Surface side | 1.0 | 30 | 15.0 | 27.0 | $Ti_{0.5}Al_{0.5}N$ | Substrate side | 1.0 | 24 | 1.00 | 0.82 | 0.05 | 0 13 | 283 |
| 1-25 | $Ti_{0.49}Al_{0.49}Hf_{0.01}N$ | Surface side | 1.0 | 30 | 15.0 | 27.0 | $Ti_{0.5}Al_{0.5}N$ | Substrate side | 1.0 | 24 | 1.00 | 0.83 | 0.03 | 0.14 | 283 |
| 1-26 | $Ti_{0.49}Al_{0.49}V_{0.01}N$ | Surface side | 1.0 | 30 | 15.0 | 27.0 | $Ti_{0.5}Al_{0.5}N$ | Substrate side | 1.0 | 24 | 1.00 | 0.85 | 0.04 | 0.11 | 288 |
| 1-27 | $Ti_{0.49}Al_{0.49}Nb_{0.01}N$ | Surface side | 1.0 | 30 | 15.0 | 27.0 | $TiC_{0.1}N_{0.9}$ | Substrate side | 1.0 | 25 | 1.00 | 0.84 | 0.02 | 0 14 | 280 |
| 1-28 | $Ti_{0.49}Al_{0.49}Ta_{0.01}N$ | Surface side | 1.0 | 30 | 15.0 | 27.0 | TiC | Substrate side | 1.0 | 21 | 1.00 | 0.10 | 0.39 | 0.51 | 287 |
| 1-29 | $Ti_{0.49}Al_{0.49}Cr_{0.01}N$ | Surface side | 1.0 | 30 | 15.0 | 27.0 | TiN | Substrate side | 1.0 | 20 | 1.00 | 0.82 | 0.04 | 0.14 | 281 |
| 1-30 | $Ti_{0.49}Al_{0.49}Mo_{0.01}N$ | Surface side | 1.0 | 30 | 15.0 | 27.0 | $Ti_{0.5}Al_{0.5}N$ | Substrate side | 1.0 | 24 | 1.00 | 0.84 | 0.03 | 0.13 | 285 |
| 1-31 | $Ti_{0.49}Al_{0.49}W_{0.01}N$ | Surface side | 1.0 | 30 | 15.0 | 27.0 | $Ti_{0.5}Al_{0.5}N$ | Substrate side | 1.0 | 24 | 1.00 | 0.82 | 0.04 | 0.14 | 284 |

TABLE 4

| | First layer | | | | | | Second layer | | | | | | | | Cutting evaluation |
|---|---|---|---|---|---|---|---|---|---|---|---|---|---|---|---|
| Sample No. | Composition | Substrate side/ Surface side | Thickness $T_1$ [μm] | Hardness $H_1$ [GPa] | $0.5 \times H_1$ | $0.9 \times H_1$ | Composition | Substrate side/ Surface side | Thickness $T_2$ [μm] | Hardness $H_2$ [GPa] | $T_1/T_2$ | $R_{(200)}$ | $R_{(111)}$ | $R_{(220)}$ | Maximum amount of wear [μm] |
| 1-32 | $Ti_{0.50}Al_{0.50}N$ | Surface side | 1.0 | 30 | 15.0 | 27.0 | $Ti_{0.2}Al_{0.8}N$ | Substrate side | 1.0 | 24 | 1.00 | 0.84 | 0.04 | 0.12 | 274 |
| 1-33 | $Ti_{0.50}Al_{0.50}N$ | Surface side | 1.0 | 30 | 15.0 | 27.0 | TiN | Substrate side | 1.0 | 20 | 1.00 | 0.84 | 0.03 | 0.13 | 271 |
| 1-34 | $Ti_{0.50}Al_{0.50}N$ | Surface side | 1.0 | 30 | 15.0 | 27.0 | $Ti_{0.5}Al_{0.5}C$ | Substrate side | 1.0 | 24 | 1.00 | 0.82 | 0.04 | 0.14 | 278 |
| 1-101 | $Ti_{0.50}Al_{0.50}N$ | Surface side | 1.0 | 30 | 15.0 | 27.0 | $Ti_{0.5}Al_{0.5}N$ | Substrate side | 1.0 | 30 | 1.00 | 0.89 | 0.02 | 0.09 | 311 |
| 1-102 | $Ti_{0.50}Al_{0.50}N$ | Surface side | 1.0 | 30 | 15.0 | 27.0 | $Ti_{0.5}Al_{0.5}N$ | Substrate side | 1.0 | 28 | 1.00 | 0.90 | 0.05 | 0.05 | 299 |
| 1-103 | $Ti_{0.50}Al_{0.50}N$ | Surface side | 1.0 | 30 | 15.0 | 27.0 | $Ti_{0.5}Al_{0.5}N$ | Substrate side | 1.0 | 10 | 1.00 | 0.95 | 0.03 | 0.02 | 311 |
| 1-104 | $Ti_{0.50}Al_{0.50}N$ | Surface side | 1.0 | 23 | 11.5 | 20.7 | $Ti_{0.5}Al_{0.5}N$ | Substrate side | 1.0 | 20 | 1.00 | 0.88 | 0.05 | 0.07 | 301 |
| 1-105 | $Ti_{0.50}Al_{0.50}N$ | Surface side | 1.0 | 42 | 21.0 | 37.8 | $Ti_{0.5}Al_{0.5}N$ | Substrate side | 1.0 | 27 | 1.00 | 0.88 | 0.05 | 0.07 | 295 |
| 1-106 | $Ti_{0.50}Al_{0.50}N$ | Surface side | 1.0 | 28 | 14.0 | 25.2 | $Ti_{0.5}Al_{0.5}N$ | Substrate side | 1.0 | 20 | 1.00 | 0.31 | 0.36 | 0.33 | 300 |

Measurement of Thickness of First Layer and Thickness of Second Layer

With regard to the cutting tools of samples No. 1-1 to No. 1-34 and samples No. 1-101 to No. 1-106, the thickness of the first layer was determined by the method described in embodiment 1. The results obtained are described in item "Thickness $T_1$ [μm]" in Table 3 and Table 4, respectively. Further, with regard to the cutting tools of samples No. 1-1 to No. 1-34 and samples No. 1-101 to No. 1-106, the thickness of the second layer was determined by the method described in embodiment 1. The results obtained are described in item "Thickness $T_2$ [μm]" in Table 3 and Table 4. respectively.

Measurement of Hardness $H_1$ of First Layer and Hardness $H_2$ of Second Layer

With regard to the cutting tools of samples No. 1-1 to No. 1-34 and samples No. 1-101 to No. 1-106, hardness $H_1$ of the first layer was determined by the method described in embodiment 1. The results obtained are described in item "Hardness $H_1$ [GPa]" in Table 3 and Table 4, respectively. Further, with regard to the cutting tools of samples No. 1-1 to No. 1-34 and samples No. 1-101 to No. 1-106. hardness $H_2$ of the second layer was determined by the method described in embodiment 1. The results obtained are described in item "Hardness $H_2$ [GPa]" in Table 3 and Table 4, respectively.

Measurement of $I_{(200)}/(I_{(200)}+I_{(111)}+I_{(220)})$, $I_{(111)}/(I_{(200)}+I_{(111)}+I_{(220)})$, and $I_{(200)}/(I_{(200)}+I_{(111)}+I_{(220)})$ With regard to the cutting tools of samples No. 1-1 to No. 1-34, and samples No. 1-101 to No. 1-106, $I_{(200)}/(I_{(200)}+I_{(111)}+I_{(220)})$ of the coating film was determined by the method described in embodiment 1. The results obtained are described in item "$R_{(200)}$" in Table 3 and Table 4, respectively. Further, with regard to the cutting tools of samples No. 1-1 to No. 1-34, and samples No. 1-101 to No. 1-106, $I_{(111)}/(I_{(200)}+I_{(111)}+I_{(220)})$ of the coating film was determined by the method described in embodiment 1. The results obtained are described in item "$R_{(111)}$" in Table 3 and Table 4, respectively. Further, with regard to the cutting tools of samples No. 1-1 to No. 1-34, and samples No. 1-101 to No. 1-106, $I_{(220)}/(I_{(200)}+I_{(111)}+I_{(220)})$ of the coating film was determined by the method described in embodiment 1. The results obtained are described in item "$R_{(220)}$" in Table 3 and Table 4, respectively.

Cutting Test

By using the cutting tools of samples No. 1-1 to No. 1-34, and samples No. 1-101 to No. 1-106 thus prepared, the following cutting test was performed.

With regard to the cutting tools of samples No. 1-1 to No. 1-34, and samples No. 1-101 to No. 1-106. a cutting test of work material was performed under the following cutting conditions. When the cutting distance reached 50 m, the cutting tool and the work material in contact with each other were once separated. Subsequently. after the passage of 3 minutes from the separation, cutting of the work material was performed again under the following cutting conditions. Until the cutting distance reached 3 km, the procedure was repeated. Subsequently, when the cutting distance reached 3 km, the maximum amount of wear at the flank face of the cutting tool was measured as the maximum amount of wear. A smaller maximum amount of wear means that the cutting tool has a long tool life even in high-load cutting. Further, a maximum amount of wear of 290 μm or less means that the cutting tool has a long tool life even in high-load cutting. The maximum amount of wear is described in item "Maximum amount of wear [μm]" in Table 3 and Table 4, respectively.

Cutting Conditions

Work material: high hardness steel SUJ2 (HRC62) (diameter: 85 mm×length: 200 mm)
Cutting rate: V=100 m/min.
Feed: f=0.2 mm/rev.
Notch: ap=0.5 mm
Wet process/dry process: wet process
The cutting conditions correspond to high-load cutting of hardened steel (high-hardness materials).

Results

Samples No. 1-1 to No. 1-34 correspond to Examples. Samples No. 1-101 to No. 1-106 correspond to Comparative Examples. From the results in Table 3 and Table 4, it has been confirmed that the cutting tools of samples No. 1-1 to No. 1-34 corresponding to Examples have a longer tool life even in high-load cutting such as cutting of high-hardness materials such as hardened steel than the cutting tools of samples No. 1-101 to No. 1-106 corresponding to Comparative Examples. The reason for this is presumed as follows. In the cutting tools of samples No. 1-1 to No. 1-34, the first layer of the coating film has high hardness and good abrasion resistance, and the coating film includes the second layer together with the first layer, so that the coating film has good chipping resistance and peeling resistance. Thereby, the coating film is less likely to break during cutting, and the wear originating from there is suppressed.

Example 2

Preparation of Cutting Tool

Samples No. 2-1 to No. 2-42

By the following production method, cutting tools of samples No. 2-1 to No. 2-42 were prepared.

Step of Preparing Substrate

As substrate preparation step, the same substrate as that in samples No. 1-1 to No. 1-15, samples No. 1-17 to No. 1-34, and samples No. 1-101 to No. 1-106 was prepared, and the substrate was set at a predetermined position of an arc ion plating apparatus.

Step of Forming Coating Film on Substrate

As step of covering with second layer, a second layer was formed on the surface of the substrate using arc ion plating method under the same conditions as in samples No. 1-1 to No. 1-15, samples No. 1-17 to No. 1-34, and samples No. 1-101 to No. 1-106 except that covering with second layer was performed under the conditions described in Tables 5 and 6 and the following targets were used as metal evaporation source. As the metal evaporation source, a target corresponding to the "composition" of the second layer described in the following Table 7 was used. Specifically, in the case where the composition of the second layer was TiAlN, a TiAl target was used as the metal evaporation source. In the case of TiCN or TiN, a Ti target was used as the metal evaporation source.

Next, as step (iv), the bias voltage was changed from the bias voltage value in covering with second layer to the bias voltage value described in the column "Step (iv)" in Tables 5 and 6 so as to perform film formation for 60 seconds. Subsequently, the film formation conditions other than the bias voltage were changed to the following conditions for covering with first layer, and film formation was performed for 60 seconds while maintaining the bias voltage. The steps (i) and (ii) were not performed.

Next, as covering with first layer, using arc ion plating method under the conditions described in Tables 5 and 6, the step of covering with first unit layer and the step of covering with second unit layer were alternately performed to form the first layer on the surface of the second layer. Specifically, the following method was used.

As the metal evaporation source, a target corresponding to the "composition" of the first layer described in the following Tables 7 and 8 was used. In other words, in the case where the composition of the first unit layer was TiAlN, a TiAl target was used as the metal evaporation source. Also, in the case where the composition of the first unit layer was TiAlSiN, a TiAlSi target was used as the metal evaporation source. Also, in the case where the composition of the second unit layer was AlClN, an AlCr target was used as the metal evaporation source. Also, in the case where the composition of the second unit layer was CrN, a Cr target was used as the metal evaporation source. $N_2$ gas was used as the reaction gas. The basal plate (substrate) temperature was set at 500° C. and the gas pressure in the apparatus was set at 4 Pa. From among the step of covering with first unit layer and the step of covering with second unit layer, the step of covering with first unit layer was performed first, and the step of covering with second unit layer was performed lastly.

TABLE 5

| Sample No. | Covering with second layer Bias voltage [V] | Step (i) Annealing Temperature [° C.]/ Time [min] | Step (ii) Ion bombardment | Step (iv) Bias Voltage [V] | Covering with first layer Covering with first unit layer/ second unit layer (Step(iii)) Bias voltage [V] |
|---|---|---|---|---|---|
| 2-1 | 30 | — | — | 32 | 35 |
| 2-2 | 30 | — | — | 32 | 35 |
| 2-3 | 30 | — | — | 32 | 35 |
| 2-4 | 30 | — | — | 32 | 35 |
| 2-5 | 30 | — | — | 32 | 35 |
| 2-6 | 30 | — | — | 32 | 35 |
| 2-7 | 30 | — | — | 32 | 35 |
| 2-8 | 30 | — | — | 32 | 35 |
| 2-9 | 30 | — | — | 32 | 35 |
| 2-10 | 30 | — | — | 32 | 35 |
| 2-11 | 30 | — | — | 32 | 35 |
| 2-12 | 800 | — | — | 700 | 35 |
| 2-13 | 800 | — | — | 700 | 35 |
| 2-14 | 800 | — | — | 700 | 35 |
| 2-15 | 800 | — | — | 700 | 35 |
| 2-16 | 800 | — | — | 700 | 35 |
| 2-17 | 800 | — | — | 700 | 35 |
| 2-18 | 800 | — | — | 700 | 35 |
| 2-19 | 800 | — | — | 700 | 35 |
| 2-20 | 800 | — | — | 700 | 35 |
| 2-21 | 800 | — | — | 700 | 35 |
| 2-22 | 800 | — | — | 700 | 35 |
| 2-23 | 800 | — | — | 700 | 35 |
| 2-24 | 800 | — | — | 700 | 35 |
| 2-25 | 800 | — | — | 700 | 35 |
| 2-26 | 800 | — | — | 700 | 35 |
| 2-27 | 800 | — | — | 700 | 35 |
| 2-28 | 800 | — | — | 700 | 35 |
| 2-29 | 800 | — | — | 700 | 35 |

TABLE 6

| Sample No. | Covering with second layer Bias voltage [V] | Step (i) Annealing Temperature [° C.]/ Time [min] | Step (ii) Ion bombardment | Step (iv) Bias voltage [V] | Covering with first layer Covering with first unit layer/ second unit layer (Step(iii)) Bias voltage [V] |
|---|---|---|---|---|---|
| 2-30 | 30 | — | — | 33 | 35 |
| 2-31 | 30 | — | — | 33 | 35 |
| 2-32 | 30 | — | — | 33 | 35 |
| 2-33 | 23 | 500/30 | — | 24 | 25 |
| 2-34 | 30 | — | — | 33 | 35 |
| 2-35 | 30 | — | — | 33 | 35 |
| 2-36 | 30 | — | — | 33 | 35 |
| 2-37 | 100 | 500/60 | — | 37 | 35 |
| 2-38 | 30 | — | — | 33 | 40 |
| 2-39 | 30 | — | — | 33 | 35 |
| 2-40 | 30 | — | — | 33 | 35 |
| 2-41 | 30 | — | — | 33 | 35 |
| 2-42 | 30 | — | — | 33 | 35 |

Characterization of Cutting Tools

With regard to the cutting tools of sample No. 2-1 to No. 2-42 thus prepared, "x", "y" and "z" in the composition of the first unit layer $Ti_xAl_yM_{1-x-y}C_zN_{1-z}$, "thickness of first unit layer", "m" in the composition of the second unit layer $Al_mCr_{1-m}N$, "thickness of second unit layer", "a", "b" and "c" in the composition of the second layer $Ti_aAl_bC_cN_{1-c}$, "thickness of first layer", "thickness of second layer", "hardness of first layer $H_1$", "hardness of second layer $H_2$", "$I_{(200)}/(I_{(200)}+I_{(111)}+I_{(220)})$" ("$R_{(200)}$"), "$I_{(111)}/(I_{(200)}+I_{(111)}+I_{(220)})$" ("$R(111)$"), and "$I_{(220)}/(I_{(200)}+I_{(111)}+I_{(220)})$" ("$R_{(220)}$") were determined, respectively, by measurement in the same manner as in Example 1. The results obtained are shown in Tables 7 and 8, respectively. The relationship among "thickness of first unit layer", "thickness of second unit layer" and "thickness of first layer" is as follows. For example, in sample 2-1, the first layer was formed by alternately laminating the first unit layers with a thickness of 15 nm and the second unit layers with a thickness of 10 nm, and the thickness Ti of the first layer was 2.5 μm.

The cutting tools of Samples No. 2-1 to No. 2-42 correspond to Examples.

TABLE 7

| | First layer | | | | | | | | | | |
|---|---|---|---|---|---|---|---|---|---|---|---|
| | First unit layer | | | | Second unit layer | | | Substrate | Thickness | Hardness | |
| Sample No | Composition | x | y | z | Thickness [nm] | Composition | m | Thickness [nm] | side/ Surface side | $T_1$ [μm] | $H_1$ [GPa] | 0.5 × $H_1$ | 0.9 × $H_1$ |
| 2-1 | TiAlSiN | 0.49 | 0.49 | 1.0 | 15 | AlCrN | 0.7 | 10 | Surface side | 2.5 | 37 | 18.5 | 33.3 |
| 2-2 | TiAlBN | 0.49 | 0.49 | 1.0 | 15 | AlCrN | 0.7 | 10 | Surface side | 2.5 | 38 | 19.0 | 34.2 |
| 2-3 | TiAlYN | 0.49 | 0.49 | 1.0 | 15 | AlCrN | 0.7 | 10 | Surface side | 2.5 | 38 | 19.0 | 34.2 |
| 2-4 | TiAlZrN | 0.49 | 0.49 | 1.0 | 15 | AlCrN | 0.7 | 10 | Surface side | 2.5 | 36 | 18.0 | 32.4 |
| 2-5 | TiAlHfN | 0.49 | 0.49 | 1.0 | 15 | AlCrN | 0.7 | 10 | Surface side | 2.5 | 36 | 18.0 | 32.4 |
| 2-6 | TiAlVN | 0.49 | 0.49 | 1.0 | 15 | AlCrN | 0.7 | 10 | Surface side | 2.5 | 35 | 17.5 | 31.5 |
| 2-7 | TAlNbN | 0.49 | 0.49 | 1.0 | 15 | AlCrN | 0.7 | 10 | Surface side | 2.5 | 35 | 17.5 | 31.5 |
| 2-8 | TiAlTaN | 0.49 | 0.49 | 1.0 | 15 | AlCrN | 0.7 | 10 | Surface side | 2.5 | 36 | 18.0 | 32.4 |
| 2-9 | TiAlCrN | 0.49 | 0.49 | 1.0 | 15 | AlCrN | 0.7 | 10 | Surface side | 2.5 | 34 | 17.0 | 30.6 |
| 2-10 | TiAlMoN | 0 49 | 0.49 | 1.0 | 15 | AlCrN | 0.7 | 10 | Surface side | 2.5 | 34 | 17.0 | 30.6 |
| 2-11 | TiAlWN | 0.49 | 0.49 | 1.0 | 15 | AlCrN | 0.7 | 10 | Surface side | 2.5 | 34 | 17.0 | 30.6 |
| 2-12 | TiAlSiN | 0.49 | 0.49 | 1.0 | 15 | AlCrN | 0.7 | 10 | Surface side | 2.5 | 37 | 18.5 | 33.3 |
| 2-13 | TiAlBN | 0 49 | 0.49 | 1.0 | 15 | AlCrN | 0.7 | 10 | Surface side | 2.5 | 38 | 19.0 | 34.2 |
| 2-14 | TiAlZrN | 0.49 | 0.49 | 1.0 | 15 | AlCrN | 0.7 | 10 | Surface side | 2.5 | 36 | 18.0 | 32.4 |
| 2-15 | TiAlNbN | 0.49 | 0.49 | 1.0 | 15 | AlCrN | 0.7 | 10 | Surface side | 2.5 | 35 | 17.5 | 31.5 |
| 2-16 | TiAlTaN | 0.49 | 0.49 | 1.0 | 15 | AlCrN | 0.7 | 10 | Surface side | 2.5 | 36 | 18.0 | 32.4 |
| 2-17 | TiAlWN | 0.49 | 0.49 | 1.0 | 15 | AlCrN | 0.7 | 10 | Surface side | 2.5 | 34 | 17.0 | 30.6 |
| 2-18 | TiAlCrN | 0.49 | 0.49 | 1.0 | 15 | AlCrN | 0 7 | 10 | Surface side | 2.5 | 34 | 17.0 | 30.6 |
| 2-19 | TiAlMoN | 0.49 | 0.49 | 1.0 | 15 | AlCrN | 0.7 | 10 | Surface side | 2.5 | 34 | 17.0 | 30.6 |
| 2-20 | TiAlBN | 0.98 | 0.01 | 1.0 | 15 | AlCrN | 0.7 | 10 | Surface side | 2.5 | 35 | 17.5 | 31.5 |
| 2-21 | TiAlBN | 0.20 | 0.60 | 1.0 | 15 | AlCrN | 0 7 | 10 | Surface side | 2.5 | 39 | 19.5 | 35.1 |
| 2-22 | TiAlBN | 0.20 | 0.70 | 1.0 | 15 | AlCrN | 0.7 | 10 | Surface side | 2.5 | 39 | 19.5 | 35.1 |
| 2-23 | TiAlSiN | 0.98 | 0.01 | 1.0 | 15 | AlCrN | 0.7 | 10 | Surface side | 2.5 | 35 | 17.5 | 31.5 |
| 2-24 | TiAlSiN | 0.20 | 0.60 | 1.0 | 15 | AlCrN | 0.7 | 10 | Surface side | 2.5 | 38 | 19.0 | 34.2 |
| 2-25 | TiAlSiCN | 0.49 | 0.49 | 0.5 | 15 | AlCrN | 0.7 | 10 | Surface side | 2.5 | 38 | 19.0 | 34.2 |
| 2-26 | TiAlSiN | 0.49 | 0.49 | 1.0 | 5 | AlCrN | 0.7 | 5 | Surface side | 2.5 | 37 | 18.5 | 33.3 |
| 2-27 | TiAlSiN | 0.49 | 0.49 | 1.0 | 50 | AlCrN | 0.7 | 50 | Surface side | 2.5 | 37 | 18.5 | 33.3 |
| 2-28 | TiAlSiN | 0.49 | 0.49 | 1.0 | 5 | AlCrN | 0.7 | 50 | Surface side | 2.5 | 37 | 18.5 | 33.3 |
| 2-29 | TiAlSiN | 0 49 | 0.49 | 1.0 | 50 | AlCrN | 0.7 | 5 | Surface side | 2.5 | 37 | 18.5 | 33.3 |

| | Second layer | | | | | | | | Cutting |
|---|---|---|---|---|---|---|---|---|---|
| Sample No | Composition | Substrate side/ Surface side | Thickness $T_2$ [μm] | Hardness $H_2$ [GPa] | $T_1/T_2$ | $R_{(200)}$ | $R_{(111)}$ | $R_{(220)}$ | Evaluation Maximum amount of wear [μm] |
| 2-1 | $Ti_{0.5}Al_{0.5}N$ | Substrate side | 0.5 | 24 | 5 | 0.87 | 0.06 | 0.07 | 229 |
| 2-2 | $Ti_{0.5}Al_{0.5}N$ | Substrate side | 0.5 | 24 | 5 | 0.89 | 0.08 | 0.03 | 231 |
| 2-3 | $Ti_{0.5}Al_{0.5}N$ | Substrate side | 0.5 | 24 | 5 | 0.89 | 0.04 | 0.07 | 237 |
| 2-4 | $Ti_{0.5}Al_{0.5}N$ | Substrate side | 0.5 | 24 | 5 | 0.86 | 0.03 | 0.11 | 239 |
| 2-5 | $Ti_{0.5}Al_{0.5}N$ | Substrate side | 0.5 | 24 | 5 | 0.89 | 0.05 | 0.06 | 238 |
| 2-6 | $Ti_{0.5}Al_{0.5}N$ | Substrate side | 0.5 | 24 | 5 | 0.86 | 0.06 | 0.08 | 258 |
| 2-7 | $Ti_{0.5}Al_{0.5}N$ | Substrate side | 0.5 | 24 | 5 | 0.88 | 0.07 | 0.05 | 253 |
| 2-8 | $Ti_{0.5}Al_{0.5}N$ | Substrate side | 0.5 | 24 | 5 | 0.86 | 0.05 | 0.09 | 273 |
| 2-9 | $Ti_{0.5}Al_{0.5}N$ | Substrate side | 0.5 | 24 | 5 | 0.85 | 0.04 | 0.11 | 269 |
| 2-10 | $Ti_{0.5}Al_{0.5}N$ | Substrate side | 0.5 | 24 | 5 | 0.87 | 0.03 | 0.10 | 271 |
| 2-11 | $Ti_{0.5}Al_{0.5}N$ | Substrate side | 0.5 | 24 | 5 | 0.87 | 0.05 | 0.08 | 272 |
| 2-12 | $TiC_{0.1}N_{0.9}$ | Substrate side | 0.5 | 22 | 5 | 0.32 | 0.20 | 0.48 | 261 |
| 2-13 | $TiC_{0.1}N_{0.9}$ | Substrate side | 0.5 | 22 | 5 | 0.33 | 0.21 | 0.46 | 267 |
| 2-14 | $TiC_{0.1}N_{0.9}$ | Substrate side | 0.5 | 22 | 5 | 0.33 | 0.19 | 0.48 | 262 |
| 2-15 | $TiC_{0.1}N_{0.9}$ | Substrate side | 0.5 | 22 | 5 | 0.33 | 0.18 | 0.49 | 264 |
| 2-16 | $TiC_{0.1}N_{0.9}$ | Substrate side | 0.5 | 22 | 5 | 0.32 | 0.18 | 0.50 | 268 |
| 2-17 | $TiC_{0.1}N_{0.9}$ | Substrate side | 0.5 | 22 | 5 | 0.32 | 0.19 | 0.49 | 271 |
| 2-18 | $TiC_{0.1}N_{0.9}$ | Substrate side | 0.5 | 22 | 5 | 0.33 | 0.13 | 0.54 | 265 |
| 2-19 | $TiC_{0.1}N_{0.9}$ | Substrate side | 0.5 | 22 | 5 | 0.32 | 0.15 | 0.53 | 263 |
| 2-20 | $TiC_{0.1}N_{0.9}$ | Substrate side | 0.5 | 22 | 5 | 0.33 | 0.19 | 0.48 | 258 |
| 2-21 | $TiC_{0.1}N_{0.9}$ | Substrate side | 0.5 | 22 | 5 | 0.33 | 0.12 | 0.55 | 271 |
| 2-22 | $TiC_{0.1}N_{0.9}$ | Substrate side | 0.5 | 22 | 5 | 0.34 | 0.19 | 0.47 | 265 |
| 2-23 | $TiC_{0.1}N_{0.9}$ | Substrate side | 0.5 | 22 | 5 | 0.31 | 0.20 | 0.49 | 256 |

TABLE 7-continued

| | | | | | | | | | |
|---|---|---|---|---|---|---|---|---|---|
| 2-24 | $TiC_{0.1}N_{0.9}$ | Substrate side | 0.5 | 22 | 5 | 0.32 | 0.21 | 0.47 | 261 |
| 2-25 | $TiC_{0.1}N_{0.9}$ | Substrate side | 0.5 | 22 | 5 | 0.30 | 0.21 | 0.49 | 265 |
| 2-26 | $TiC_{0.1}N_{0.9}$ | Substrate side | 0.5 | 22 | 5 | 0.31 | 0.21 | 0.48 | 263 |
| 2-27 | $TiC_{0.1}N_{0.9}$ | Substrate side | 0.5 | 22 | 5 | 0.33 | 0.19 | 0.48 | 260 |
| 2-28 | $TiC_{0.1}N_{0.9}$ | Substrate side | 0.5 | 22 | 5 | 0.31 | 0.14 | 0.55 | 264 |
| 2-29 | $TiC_{0.1}N_{0.9}$ | Substrate side | 0.5 | 22 | 5 | 0.29 | 0.15 | 0.56 | 266 |

TABLE 8

| | First layer | | | | | | | | | | | |
|---|---|---|---|---|---|---|---|---|---|---|---|---|
| | First unit layer | | | | | Second unit layer | | | Substrate | Thickness | Hardness | | |
| Sample No | Composition | x | y | z | Thickness [nm] | Composition | m | Thickness [nm] | side/ Surface side | $T_1$ [μm] | $H_1$ [GPa] | $0.5 \times H_1$ | $0.9 \times H_1$ |
| 2-30 | TiAlSiN | 0.49 | 0.49 | 1.0 | 15 | AlCrN | 0.7 | 10 | Substrate side | 2.5 | 37 | 18.5 | 33.3 |
| 2-31 | TiAlSiN | 0.49 | 0.49 | 1.0 | 15 | CrN | 0 | 10 | Surface side | 2.5 | 37 | 18.5 | 33.3 |
| 2-32 | TiAlSiN | 0.49 | 0.49 | 1.0 | 15 | AlCrN | 0.8 | 10 | Surface side | 2.5 | 37 | 18.5 | 33.3 |
| 2-33 | TiAlSiN | 0.49 | 0.49 | 1.0 | 15 | AlCrN | 0.7 | 10 | Surface side | 2.5 | 25 | 12.5 | 22.5 |
| 2-34 | TiAlSiN | 0.49 | 0.49 | 1.0 | 15 | AlCrN | 0.7 | 10 | Surface side | 2.5 | 40 | 20.0 | 36.0 |
| 2-35 | TiAlSiN | 0.49 | 0.49 | 1.0 | 15 | AlCrN | 0.7 | 10 | Surface side | 0.2 | 37 | 18.5 | 33.3 |
| 2-36 | TiAlSiN | 0.49 | 0.49 | 1.0 | 15 | AlCrN | 0.7 | 10 | Surface side | 10 | 37 | 18.5 | 33.3 |
| 2-37 | TiAlSiN | 0.49 | 0.49 | 1.0 | 15 | AlCrN | 0.7 | 10 | Surface side | 2.5 | 37 | 18.5 | 33.3 |
| 2-38 | TiAlN | 0.99 | 0.01 | 0 | 15 | AlCrN | 0.7 | 10 | Surface side | 2.5 | 37 | 18.5 | 33.3 |
| 2-39 | TiAlN | 0.20 | 0.80 | 0 | 15 | AlCrN | 0.7 | 10 | Surface side | 2.5 | 37 | 18.5 | 33.3 |
| 2-40 | TiAlSiN | 0.49 | 0.49 | 1.0 | 15 | AlCrN | 0.7 | 10 | Surface side | 2.5 | 37 | 18.5 | 33.3 |
| 2-41 | TiAlSiN | 0.49 | 0.49 | 1.0 | 15 | AlCrN | 0.7 | 10 | Surface side | 2.5 | 37 | 18.5 | 33.3 |
| 2-42 | TiAlSiN | 0.49 | 0.49 | 1.0 | 15 | AlCrN | 0.7 | 10 | Surface side | 2.5 | 37 | 18.5 | 33.3 |

| | Second layer | | | | | | | | Cutting evaluation |
|---|---|---|---|---|---|---|---|---|---|
| Sample No | Composition | Substrate side/ Surface side | Thickness $T_2$ [μm] | Hardness $H_2$ [GPa] | $T_1/T_2$ | $R_{(200)}$ | $R_{(111)}$ | $R_{(220)}$ | Maximum amount of wear [μm] |
| 2-30 | $Ti_{0.5}Al_{0.5}N$ | Surface side | 0.5 | 24 | 50.00 | 0.87 | 0.06 | 0.07 | 271 |
| 2-31 | $Ti_{0.5}Al_{0.5}N$ | Substrate side | 0.5 | 24 | 50.00 | 0.82 | 0.04 | 0.14 | 289 |
| 2-32 | $Ti_{0.5}Al_{0.5}N$ | Substrate side | 0.5 | 24 | 50.00 | 0.84 | 0.03 | 0.13 | 274 |
| 2-33 | $Ti_{0.5}Al_{0.5}N$ | Substrate side | 0.5 | 22 | 5.00 | 0.85 | 0.05 | 0.10 | 287 |
| 2-34 | $Ti_{0.5}Al_{0.5}N$ | Substrate side | 0.5 | 24 | 5.00 | 0.84 | 0.01 | 0.15 | 288 |
| 2-35 | $Ti_{0.5}Al_{0.5}N$ | Substrate side | 10.0 | 24 | 0.02 | 0.85 | 0.05 | 0.10 | 272 |
| 2-36 | $Ti_{0.5}Al_{0.5}N$ | Substrate side | 0.2 | 24 | 50.00 | 0.84 | 0.04 | 0.12 | 279 |
| 2-37 | $Ti_{0.5}Al_{0.5}N$ | Substrate side | 0.5 | 24 | 5.00 | 0.43 | 0.45 | 0.12 | 284 |
| 2-38 | $Ti_{0.5}Al_{0.5}N$ | Substrate side | 0.5 | 24 | 5.00 | 0.85 | 0.04 | 0.11 | 282 |
| 2-39 | $Ti_{0.5}Al_{0.5}N$ | Substrate side | 0.5 | 24 | 5.00 | 0.82 | 0.03 | 0.15 | 270 |
| 2-40 | $Ti_{0.2}Al_{0.8}N$ | Substrate side | 0.5 | 24 | 5.00 | 0.85 | 0.03 | 0.12 | 282 |
| 2-41 | TiN | Substrate side | 0.5 | 20 | 5.00 | 0.85 | 0.04 | 0.11 | 275 |
| 2-42 | $Ti_{0.5}Al_{0.5}C$ | Substrate side | 0.5 | 24 | 5.00 | 0.81 | 0.02 | 0.17 | 284 |

Cutting Test

The cutting tools of samples No. 2-1 to No. 2-42 thus prepared were subjected to "cutting test" in the same manner as in Example 1 so as to determine the "maximum amount of wear". The results obtained are described in item "Maximum amount of wear [μm]" in Table 7 and Table 8, respectively.

Results

Samples No. 2-1 to No. 2-42 correspond to Examples. From the results in Table 7 and Table 8, it has been confirmed that the cutting tools of samples No. 2-1 to No. 2-42 corresponding to Examples have a long tool life even in high-load cutting such as cutting of high-hardness materials such as hardened steel. The reason for this is presumed as follows. As in Example 1, in the cutting tools of samples No. 2-1 to No. 2-42, the first layer of the coating film has high hardness and good abrasion resistance, and the coating film includes the second layer together with the first layer, so that the coating film has good chipping resistance and peeling resistance. Thereby, the coating film is less likely to break during cutting, and the wear originating from there is suppressed.

Example 3

Preparation of Cutting Tool

Samples No. 3-1 to No. 3-43, and Sample No. 3-101

By the following manufacturing method, cutting tools of samples No. 3-1 to No. 3-43, and sample No. 3-101 were prepared.

Step of Preparing Substrate

As substrate preparation step, the same substrate as that in samples No. 1-1 to No. 1-15, samples No. 1-17 to No. 1-34, and samples No. 1-101 to No. 1-106 was prepared, and the substrate was set at a predetermined position of an arc ion plating apparatus.

Step of Forming Coating Film on Substrate

As step of covering with second layer, a second layer was formed on the surface of the substrate using arc ion plating method under the same conditions as in samples No. 1-1 to No. 1-15, samples No. 1-17 to No. 1-34, and samples No. 1-101 to No. 1-106 except that covering with second layer was performed under the conditions described in Tables 9 and 10 and the following targets were used as metal evaporation source. As the metal evaporation source, a target corresponding to the "composition" of the second layer described in the following Tables 11 and 12 was used. Specifically, in the case where the composition of the second layer was TiAlN or TiAlC, a TiAl target was used as the metal evaporation source. In the case where the composition of the second layer was TiCN, TiC or TiN, a Ti target was used as the metal evaporation source.

Next, in order to prepare a cutting tool of sample No. 3-30, as step (i), the surface of the second layer was annealed under the temperature conditions described in the column "Annealing Temperature [° C.]" in Tables 9 and 10. In Tables 9 and 10, "-" in the column "Annealing Temperature [° C.]" means that step (i) was not performed.

Next, as step (iv), the bias voltage in covering with second layer was adjusted to the bias voltage described in column "Step (iv)" in Tables 9 and 10 so as to perform film formation for 60 seconds. Subsequently, the film formation conditions other than the bias voltage were changed to the following conditions for covering with first layer, and film formation was performed for 60 seconds while maintaining the bias voltage. Step (ii) was not performed.

Next, as covering with first layer, using arc ion plating method under the conditions described in Tables 9 and 10, covering with first unit layer and covering with third unit layer were alternately performed to form the first layer on the surface of the second layer. Specifically, the following method was used. As the metal evaporation source, a target corresponding to the "composition" of the first layer described in the following Tables 11 and 12 was used. In other words, in the case where the composition of the first unit layer was TiAlN, a TiAl target was used as the metal evaporation source. Also, in the case where the composition of the first unit layer was TiAlSiN, a TiAlSi target was used as the metal evaporation source. Also, in the case where the composition of the third unit layer was TiAlN, a TiAl target was used as the metal evaporation source. $N_2$ gas was used as the reaction gas. The basal plate (substrate) temperature was set at 500° C. and the gas pressure in the apparatus was set at 4 Pa. From among the step of covering with first unit layer and the step of covering with third unit layer, the step of covering with first unit layer was performed first, and the step of covering with third unit layer was performed lastly.

TABLE 9

| Sample No. | Covering with second layer Bias voltage [V] | Step(i) Annealing Temperature [° C.]/ Time [min] | Step(ii) Ion bombardment | Step(iv) Bias voltage [V] | Covering with first layer Covering with first unit layer/ third unit layer(Step(iii) Bias voltage [V] |
|---|---|---|---|---|---|
| 3-1 | 30 | — | — | 32 | 35 |
| 3-2 | 30 | — | — | 32 | 35 |
| 3-3 | 30 | — | — | 32 | 35 |
| 3-4 | 30 | — | — | 32 | 35 |
| 3-5 | 30 | — | — | 32 | 35 |
| 3-6 | 30 | — | — | 32 | 35 |
| 3-7 | 30 | — | — | 32 | 35 |
| 3-8 | 30 | — | — | 32 | 35 |
| 3-9 | 30 | — | — | 32 | 35 |
| 3-10 | 30 | — | — | 32 | 35 |
| 3-11 | 30 | — | — | 32 | 35 |
| 3-12 | 800 | — | — | 700 | 35 |
| 3-13 | 800 | — | — | 700 | 35 |
| 3-14 | 30 | — | — | 32 | 35 |
| 3-15 | 30 | — | — | 32 | 35 |
| 3-16 | 30 | — | — | 32 | 35 |
| 3-17 | 30 | — | — | 32 | 35 |
| 3-18 | 30 | — | — | 32 | 35 |
| 3-19 | 30 | — | — | 32 | 35 |
| 3-20 | 30 | — | — | 32 | 35 |
| 3-21 | 30 | — | — | 32 | 35 |
| 3-22 | 30 | — | — | 32 | 35 |
| 3-23 | 30 | — | — | 32 | 35 |
| 3-24 | 30 | — | — | 32 | 35 |
| 3-25 | 30 | — | — | 32 | 35 |
| 3-26 | 30 | — | — | 32 | 35 |
| 3-27 | 30 | — | — | 32 | 35 |
| 3-28 | 30 | — | — | 32 | 35 |
| 3-29 | 800 | — | — | 700 | 35 |
| 3-30 | 30 | 500/60 | — | 32 | 35 |
| 3-101 | 15 | — | — | 32 | 35 |

TABLE 10

| Sample No. | Covering with second layer Bias voltage [V] | Step(i) Annealing Temperature [° C.]/ Time [min] | Step(ii) Ion bombardment | Step(iv) Bias voltage [V] | Covering with first layer Covering with first unit layer/ third unit layer(Step(iii)) Bias voltage [V] |
|---|---|---|---|---|---|
| 3-31 | 30 | — | — | 33 | 35 |
| 3-32 | 30 | — | — | 33 | 35 |
| 3-33 | 30 | — | — | 33 | 35 |
| 3-34 | 23 | 500/30 | — | 24 | 25 |
| 3-35 | 30 | — | — | 33 | 50 |
| 3-36 | 30 | — | — | 33 | 35 |
| 3-37 | 30 | — | — | 33 | 35 |
| 3-38 | 100 | 500/60 | — | 37 | 35 |
| 3-39 | 30 | — | — | 33 | 40 |
| 3-40 | 30 | — | — | 33 | 35 |
| 3-41 | 30 | — | — | 33 | 35 |
| 3-42 | 30 | — | — | 33 | 35 |
| 3-43 | 30 | — | — | 33 | 35 |

Characterization of Cutting Tools

With regard to the cutting tools of samples No. 3-1 to No. 3-43 and sample No. 3-101 thus prepared, "x", "y" and "z" in the composition of the first unit layer $Ti_xAl_yM_{1-x-y}C_zN_{1-z}$, "thickness of first unit layer", "n" in the composition of the third unit layer $Ti_nAl_{1-n}N$, "thickness of third unit layer", "a", "b" and "c" in the composition of the second layer $Ti_aAl_bC_cN_{1-c}$, "thickness of first layer", "thickness of second layer", "hardness of first layer $H_1$", "hardness of second layer $H_2$", "$I_{(200)}/(I_{(200)}+I_{(111)}+I_{(220)})$" ("$R_{(200)}$"), "$I_{(111)}/(I_{(200)}+I_{(111)}+I_{(220)})$" ("$R_{(111)}$"), and "$I_{(220)}/(I_{(200)}+I_{(111)}+I_{(220)})$" ("$R_{(220)}$") were determined, respectively, by measurement in the same manner as in Example 1. The results obtained are shown in Tables 11 and 12, respectively. The relationship among "thickness of first unit layer", "thickness of third unit layer" and "thickness of first layer" is as follows. For example, in sample 3-1, the first layer was formed by alternately laminating the first unit layers with a thickness of 10 nm and the third unit layers with a thickness of 15 nm, and the thickness $T_1$ of the first layer was 2.5 μm. The cutting tools of samples No. 3-1 to No. 3-43 correspond to Examples, and the cutting tool of sample No. 3-101 correspond to Comparative Example.

TABLE 11

| | First layer | | | | | | | | | | |
|---|---|---|---|---|---|---|---|---|---|---|---|
| | First unit layer | | | | | Third unit layer | | Substrate | Thickness | Hardness | | |
| Sample No | Composition | x | y | z | Thickness [nm] | Composition | n | Thickness [nm] | side/ Surface side | $T_1$ [μm] | $H_1$ [GPa] | 0.5 × $H_1$ | 0.9 × $H_1$ |
| 3-1 | TiAlSiN | 0.49 | 0.49 | 1.0 | 10 | TiAlN | 0.5 | 15 | Surface side | 2.5 | 37 | 18.5 | 33.3 |
| 3-2 | TiAlBN | 0.49 | 0.49 | 1.0 | 10 | TiAlN | 0.5 | 15 | Surface side | 2.5 | 38 | 19.0 | 34.2 |
| 3-3 | TiAlYN | 0.49 | 0.49 | 1.0 | 10 | TiAlN | 0.5 | 15 | Surface side | 2.5 | 38 | 19.0 | 34.2 |
| 3-4 | TiAlZrN | 0.49 | 0.49 | 1.0 | 10 | TiAlN | 0.5 | 15 | Surface side | 2.5 | 36 | 18.0 | 32.4 |
| 3-5 | TiAlHfN | 0.49 | 0.49 | 1.0 | 10 | TiAlN | 0.5 | 15 | Surface side | 2.5 | 36 | 18.0 | 32.4 |
| 3-6 | TiAlVN | 0.49 | 0.49 | 1.0 | 10 | TiAlN | 0.5 | 15 | Surface side | 2.5 | 35 | 17.5 | 31.5 |
| 3-7 | TiAlNbN | 0.49 | 0.49 | 1.0 | 10 | TiAlN | 0.5 | 15 | Surface side | 2.5 | 35 | 17.5 | 31.5 |
| 3-8 | TiAlTaN | 0.49 | 0.49 | 1.0 | 10 | TiAlN | 0.5 | 15 | Surface side | 2.5 | 36 | 18.0 | 32.4 |
| 3-9 | TiAlCrN | 0.49 | 0.49 | 1.0 | 10 | TiAlN | 0.5 | 15 | Surface side | 2.5 | 34 | 17.0 | 30.6 |
| 3-10 | TiAlMoN | 0.49 | 0.49 | 1.0 | 10 | TiAlN | 0.5 | 15 | Surface side | 2.5 | 34 | 17.0 | 30.6 |
| 3-11 | TiAlWN | 0.49 | 0.49 | 1.0 | 10 | TiAlN | 0.5 | 15 | Surface side | 2.5 | 34 | 17.0 | 30.6 |
| 3-12 | TiAlSiN | 0.49 | 0.49 | 1.0 | 10 | TiAlN | 0.5 | 15 | Surface side | 2.5 | 37 | 18.5 | 33.3 |
| 3-13 | TiAlBN | 0.49 | 0.49 | 1.0 | 10 | TiAlN | 0.5 | 15 | Surface side | 2.5 | 38 | 19.0 | 34.2 |
| 3-14 | TiAlBN | 0.98 | 0.01 | 1.0 | 10 | TiAlN | 0.5 | 15 | Surface side | 2.5 | 35 | 17.5 | 31.5 |
| 3-15 | TiAlBN | 0.20 | 0.60 | 1.0 | 10 | TiAlN | 0.5 | 15 | Surface side | 2.5 | 39 | 19.5 | 35.1 |
| 3-16 | TiAlBN | 0.20 | 0.70 | 1.0 | 10 | TiAlN | 0.5 | 15 | Surface side | 2.5 | 39 | 19.5 | 35.1 |
| 3-17 | TiAlSiN | 0.98 | 0.01 | 1.0 | 10 | TiAlN | 0.5 | 15 | Surface side | 2.5 | 35 | 17.5 | 31.5 |
| 3-18 | TiAlSiN | 0.20 | 0.60 | 1.0 | 10 | TiAlN | 0.5 | 15 | Surface side | 2.5 | 38 | 19.0 | 34.2 |
| 3-19 | TiAlSiN | 0.20 | 0.70 | 1.0 | 10 | TiAlN | 0.5 | 15 | Surface side | 2.5 | 38 | 19.0 | 34.2 |
| 3-20 | TiAlBCN | 0.49 | 0.49 | 0.5 | 10 | TiAlN | 0.5 | 15 | Surface side | 2.5 | 39 | 19.5 | 35.1 |
| 3-21 | TiAlBN | 0.49 | 0.49 | 1.0 | 5 | TiAlN | 0.5 | 5 | Surface side | 2.5 | 38 | 19.0 | 34.2 |
| 3-22 | TiAlBN | 0.49 | 0.49 | 1.0 | 50 | TiAlN | 0.5 | 50 | Surface side | 2.5 | 38 | 19.0 | 34.2 |
| 3-23 | TiAlBN | 0.49 | 0.49 | 1.0 | 5 | TiAlN | 0.5 | 50 | Surface side | 2.5 | 38 | 19.0 | 34.2 |
| 3-24 | TiAlBN | 0.49 | 0.49 | 1.0 | 50 | TiAlN | 0.5 | 5 | Surface side | 2.5 | 38 | 19.0 | 34.2 |
| 3-25 | TiAlSiN | 0.49 | 0.49 | 1.0 | 10 | TiAlN | 0.5 | 15 | Surface side | 0.2 | 37 | 18.5 | 33.3 |
| 3-26 | TiAlBN | 0.49 | 0.49 | 1.0 | 10 | TiAlN | 0.5 | 15 | Surface side | 10.0 | 38 | 19.0 | 34.2 |
| 3-27 | TiAlSiN | 0.49 | 0.49 | 1.0 | 10 | TiAlN | 0.5 | 15 | Surface side | 0.2 | 37 | 18.5 | 33.3 |
| 3-28 | TiAlBN | 0.49 | 0.49 | 1.0 | 10 | TiAlN | 0.5 | 15 | Surface side | 10.0 | 38 | 19.0 | 34.2 |
| 3-29 | TiAlBN | 0.49 | 0.49 | 1.0 | 10 | TiAlN | 0.5 | 15 | Surface side | 2.5 | 38 | 19.0 | 34.2 |
| 3-30 | TiAlBN | 0.49 | 0.49 | 1.0 | 10 | TiAlN | 0.5 | 15 | Surface side | 2.5 | 38 | 19.0 | 34.2 |
| 3-101 | TiAlBN | 0.49 | 0.49 | 1.0 | 10 | TiAlN | 0.5 | 15 | Surface side | 2.5 | 38 | 19.0 | 34.2 |

| | Second layer | | | | | | | Cutting evaluation |
|---|---|---|---|---|---|---|---|---|
| Sample No | Composition | Substrate side/ Surface side | Thickness $T_2$ [μm] | Hardness $H_2$ [GPa] | $T_1/T_2$ | $R_{(200)}$ | $R_{(111)}$ | $R_{(220)}$ | Maximum Amount of wear [μm] |
| 3-1 | $Ti_{0.5}Al_{0.5}N$ | Substrate side | 0.5 | 27 | 5.00 | 0.89 | 0.03 | 0.08 | 220 |
| 3-2 | $Ti_{0.5}Al_{0.5}N$ | Substrate side | 0.5 | 27 | 5.00 | 0.86 | 0.05 | 0.09 | 221 |
| 3-3 | $Ti_{0.5}Al_{0.5}N$ | Substrate side | 0.5 | 27 | 5.00 | 0.88 | 0.04 | 0.08 | 227 |
| 3-4 | $Ti_{0.5}Al_{0.5}N$ | Substrate side | 0.5 | 27 | 5.00 | 0.86 | 0.06 | 0.08 | 229 |
| 3-5 | $Ti_{0.5}Al_{0.5}N$ | Substrate side | 0.5 | 27 | 5.00 | 0.89 | 0.04 | 0.07 | 239 |
| 3-6 | $Ti_{0.5}Al_{0.5}N$ | Substrate side | 0.5 | 27 | 5.00 | 0.89 | 0.04 | 0.07 | 248 |
| 3-7 | $Ti_{0.5}Al_{0.5}N$ | Substrate side | 0.5 | 27 | 5.00 | 0.89 | 0.05 | 0.06 | 245 |
| 3-8 | $Ti_{0.5}Al_{0.5}N$ | Substrate side | 0.5 | 27 | 5.00 | 0.85 | 0.07 | 0.08 | 261 |
| 3-9 | $Ti_{0.5}Al_{0.5}N$ | Substrate side | 0.5 | 27 | 5.00 | 0.86 | 0.04 | 0.10 | 259 |
| 3-10 | $Ti_{0.5}Al_{0.5}N$ | Substrate side | 0.5 | 27 | 5.00 | 0.88 | 0.07 | 0.05 | 260 |
| 3-11 | $Ti_{0.5}Al_{0.5}N$ | Substrate side | 0.5 | 27 | 5.00 | 0.87 | 0.04 | 0.09 | 263 |
| 3-12 | $TiC_{0.1}N_{0.9}$ | Substrate side | 0.5 | 22 | 5.00 | 0.32 | 0.18 | 0.50 | 255 |
| 3-13 | $TiC_{0.1}N_{0.9}$ | Substrate side | 0.5 | 22 | 5.00 | 0.31 | 0.14 | 0.55 | 251 |
| 3-14 | $Ti_{0.5}Al_{0.5}N$ | Substrate side | 0.5 | 27 | 5.00 | 0.87 | 0.03 | 0.10 | 265 |
| 3-15 | $Ti_{0.5}Al_{0.5}N$ | Substrate side | 0.5 | 27 | 5.00 | 0.85 | 0.04 | 0.11 | 231 |
| 3-16 | $Ti_{0.5}Al_{0.5}N$ | Substrate side | 0.5 | 27 | 5.00 | 0.86 | 0.05 | 0.09 | 240 |
| 3-17 | $Ti_{0.5}Al_{0.5}N$ | Substrate side | 0.5 | 27 | 5.00 | 0.88 | 0.01 | 0.11 | 232 |
| 3-18 | $Ti_{0.5}Al_{0.5}N$ | Substrate side | 0.5 | 27 | 5.00 | 0.87 | 0.05 | 0.08 | 241 |
| 3-19 | $Ti_{0.5}Al_{0.5}N$ | Substrate side | 0.5 | 27 | 5.00 | 0.86 | 0.01 | 0.13 | 231 |
| 3-20 | $Ti_{0.5}Al_{0.5}N$ | Substrate side | 0.5 | 27 | 5.00 | 0.86 | 0.03 | 0.11 | 245 |
| 3-21 | $Ti_{0.5}Al_{0.5}N$ | Substrate side | 0.5 | 27 | 5.00 | 0.83 | 0.12 | 0.05 | 251 |
| 3-22 | $Ti_{0.5}Al_{0.5}N$ | Substrate side | 0.5 | 27 | 5.00 | 0.89 | 0.03 | 0.08 | 254 |

TABLE 11-continued

| | | | | | | | | | |
|---|---|---|---|---|---|---|---|---|---|
| 3-23 | $Ti_{0.5}Al_{0.5}N$ | Substrate side | 0.5 | 27 | 5.00 | 0.88 | 0.04 | 0.08 | 241 |
| 3-24 | $Ti_{0.5}Al_{0.5}N$ | Substrate side | 0.5 | 27 | 5.00 | 0.89 | 0.03 | 0.08 | 252 |
| 3-25 | $Ti_{0.5}Al_{0.5}N$ | Substrate side | 0.2 | 27 | 1.00 | 0.88 | 0.04 | 0.08 | 246 |
| 3-26 | $Ti_{0.5}Al_{0.5}N$ | Substrate side | 0.2 | 27 | 50.00 | 0.84 | 0.06 | 0.10 | 252 |
| 3-27 | $Ti_{0.5}Al_{0.5}N$ | Substrate side | 10.0 | 27 | 0.02 | 0.87 | 0.06 | 0.07 | 253 |
| 3-28 | $Ti_{0.5}Al_{0.5}N$ | Substrate side | 10.0 | 27 | 1.00 | 0.80 | 0.03 | 0.17 | 255 |
| 3-29 | TiC | Substrate side | 0.5 | 21 | 5.00 | 0.31 | 0.22 | 0.47 | 275 |
| 3-30 | $Ti_{0.4}Al_{0.6}N$ | Substrate side | 1.0 | 26 | 2.50 | 0.88 | 0.04 | 0.08 | 251 |
| 3-101 | TiN | Substrate side | 0.5 | 15 | 5.00 | 0.89 | 0.04 | 0.07 | 301 |

TABLE 12

| | First layer | | | | | | | | | | |
|---|---|---|---|---|---|---|---|---|---|---|---|
| | First unit layer | | | | Third unit layer | | | Substrate | Thickness | Hardness | | |
| Sample No | Composition | x | y | z | Thickness [nm] | Composition | n | Thickness [nm] | side/ Surface side | $T_1$ [μm] | $H_1$ [GPa] | 0.5 × $H_1$ | 0.9 × $H_1$ |
| 3-31 | TiAlSiN | 0.49 | 0.49 | 1 | 10 | TiAlN | 0.5 | 15 | Substrate side | 2.5 | 37 | 18.5 | 33.3 |
| 3-32 | TiAlSiN | 0.49 | 0.49 | 1 | 10 | TiN | 0 | 15 | Surface side | 2.5 | 37 | 18.5 | 33.3 |
| 3-33 | TiAlSiN | 0.49 | 0.49 | 1 | 10 | TiAlN | 0.8 | 15 | Surface side | 2.5 | 37 | 18.5 | 33.3 |
| 3-34 | TiAlSiN | 0.49 | 0.49 | 1 | 10 | TiAlN | 0.5 | 15 | Surface side | 2.5 | 25 | 12.5 | 22.5 |
| 3-35 | TiAlSiN | 0.49 | 0.49 | 1 | 10 | TiAlN | 0.5 | 15 | Surface side | 2.5 | 40 | 20.0 | 36.0 |
| 3-36 | TiAlSiN | 0.49 | 0.49 | 1 | 10 | TiAlN | 0.5 | 15 | Surface side | 0.2 | 37 | 18.5 | 33.3 |
| 3-37 | TiAlSiN | 0.49 | 0.49 | 1 | 10 | TiAlN | 0.5 | 15 | Surface side | 10.0 | 37 | 18.5 | 33.3 |
| 3-38 | TiAlSiN | 0.49 | 0.49 | 1 | 10 | TiAlN | 0.5 | 15 | Surface side | 2.5 | 37 | 18.5 | 33.3 |
| 3-39 | TiAlN | 0.99 | 0.01 | 0 | 10 | TiAlN | 0.5 | 15 | Surface side | 2.5 | 37 | 18.5 | 33.3 |
| 3-40 | TiAlN | 0.20 | 0.80 | 0 | 10 | TiAlN | 0.5 | 15 | Surface side | 2.5 | 37 | 18.5 | 33.3 |
| 3-41 | TiAlSiN | 0.49 | 0.49 | 1 | 10 | TiAlN | 0.5 | 15 | Surface side | 2.5 | 37 | 18.5 | 33.3 |
| 3-42 | TiAlSiN | 0.49 | 0.49 | 1 | 10 | TiAlN | 0.5 | 15 | Surface side | 2.5 | 37 | 18.5 | 33.3 |
| 3-43 | TiAlSiN | 0.49 | 0.49 | 1 | 10 | TiAlN | 0.5 | 15 | Surface side | 2.5 | 37 | 18.5 | 33.3 |

| | Second layer | | | | | | | | Cutting evaluation |
|---|---|---|---|---|---|---|---|---|---|
| Sample No | Composition | Substrate side/ Surface side | Thickness $T_2$ [μm] | Hardness $H_2$ [GPa] | $T_1/T_2$ | $R_{(200)}$ | $R_{(111)}$ | $R_{(220)}$ | Maximum amount of wear [μm] |
| 3-31 | $Ti_{0.5}Al_{0.5}N$ | Surface side | 0.5 | 27 | 5.00 | 0.84 | 0.04 | 0.12 | 279 |
| 3-32 | $Ti_{0.5}Al_{0.5}N$ | Substrate side | 0.5 | 27 | 5.00 | 0.85 | 0.05 | 0.10 | 289 |
| 3-33 | $Ti_{0.5}Al_{0.5}N$ | Substrate side | 0.5 | 27 | 5.00 | 0.85 | 0.03 | 0.12 | 275 |
| 3-34 | $Ti_{0.5}Al_{0.5}N$ | Substrate side | 0.5 | 22 | 5.00 | 0.85 | 0.04 | 0.11 | 275 |
| 3-35 | $Ti_{0.5}Al_{0.5}N$ | Substrate side | 0.5 | 27 | 5.00 | 0.89 | 0.01 | 0.10 | 290 |
| 3-36 | $Ti_{0.5}Al_{0.5}N$ | Substrate side | 10.0 | 27 | 0.02 | 0.85 | 0.04 | 0.11 | 284 |
| 3-37 | $Ti_{0.5}Al_{0.5}N$ | Substrate side | 0.2 | 27 | 50.00 | 0.88 | 0.05 | 0.07 | 271 |
| 3-38 | $Ti_{0.5}Al_{0.5}N$ | Substrate side | 0.5 | 27 | 5.00 | 0.43 | 0.45 | 0.12 | 272 |
| 3-39 | $Ti_{0.5}Al_{0.5}N$ | Substrate side | 0.5 | 27 | 5.00 | 0.85 | 0.06 | 0.09 | 290 |
| 3-40 | $Ti_{0.5}Al_{0.5}N$ | Substrate side | 0.5 | 27 | 5.00 | 0.82 | 0.04 | 0.14 | 270 |
| 3-41 | $Ti_{0.2}Al_{0.8}N$ | Substrate side | 0.5 | 27 | 5.00 | 0.85 | 0.04 | 0.11 | 279 |
| 3-42 | TiN | Substrate side | 0.5 | 20 | 5.00 | 0.81 | 0.02 | 0.17 | 288 |
| 3-43 | $Ti_{0.5}Al_{0.5}C$ | Substrate side | 0.5 | 27 | 5.00 | 0.84 | 0.05 | 0.11 | 275 |

Cutting Test

The cutting tools of samples No. 3-1 to No. 3-43 and sample No. 3-101 thus prepared were subjected to "cutting test" in the same manner as in Example 1 so as to determine the "maximum amount of wear". The results obtained are described in item "Maximum amount of wear [μm]" in Table 11 and Table 12, respectively.

Results

Samples No. 3-1 to No. 3-43 correspond to Examples. Also, sample No. 3-101 corresponds to Comparative Example. From the results in Table 11 and Table 12, it has been confirmed that the cutting tools of samples No. 3-1 to No. 3-43 corresponding to Examples have a longer tool life even in high-load cutting such as cutting of high-hardness materials such as hardened steel than sample No. 3-101 corresponding to Comparative Example. The reason for this is presumed as follows. As in Example 1, in the cutting tools of samples No. 3-1 to No. 3-43, the first layer of the coating film has high hardness and good abrasion resistance, and the coating film includes the second layer together with the first layer, so that the coating film has good chipping resistance and peeling resistance. Thereby, the coating film is less likely to break during cutting, and the wear originating from there is suppressed.

Example 4

Preparation of Cutting Tool

[Samples No. 4-1 to No. 4-28]

By the following production method, cutting tools of samples No. 4-1 to No. 4-28 were prepared.

Step of Preparing Substrate

As substrate preparation step, the same substrate as that in samples No. 1-1 to No. 1-15, samples No. 1-17 to No. 1-34, and samples No. 1-101 to No. 1-106 was prepared, and the substrate was set at a predetermined position of an arc ion plating apparatus.

Step of Forming Coating Film on Substrate

As step of covering with second layer, a second layer was formed on the surface of the substrate using arc ion plating method under the same conditions as in samples No. 1-1 to No. 1-15, samples No. 1-17 to No. 1-34, and samples No. 1-101 to No. 1-106 except that covering with second layer was performed under the conditions described in Table 13 and the following targets were used as metal evaporation source.

As the metal evaporation source, a target corresponding to the "composition" of the second layer described in the following Table 14 was used. Specifically, in the case where the composition of the second layer was TiAlN or TiAlC, a Ti target and an Al target were used as the metal evaporation source. In the case where the composition of the second layer was TiCN or TiN, a Ti target was used as the metal evaporation source.

Next, as step (iv), the bias voltage was changed from the bias voltage value in covering with second layer to the bias voltage value described in column "step (iv)" in Table 13 so as to perform film formation for 60 seconds. Subsequently, the film formation conditions other than the bias voltage were changed to the following conditions for covering with first layer, and film formation was performed for 60 seconds while maintaining the bias voltage. Steps (i) and (ii) were not performed.

Next, as covering with first layer, using arc ion plating method under the conditions described in Table 13, the step of covering with first unit layer and the step of covering with second unit layer were alternately performed to form the first layer on the surface of the second layer. Specifically, the following method was used. As the metal evaporation source, a target corresponding to the "composition" of the first layer described in the following Table 14 was used. In other words, in the case where the composition of the first unit layer was TiAlN, a TiAl target was used as the metal evaporation source. Also, for example, in the case where the composition of the first unit layer was TiAlSiN, a TiAlSi target was used as the metal evaporation source. Also, in the case where the composition of the second unit layer was AlCrN, an AlCr target was used as the metal evaporation source. Also, in the case where the composition of the second unit layer was CrN, a Cr target was used as the metal evaporation source. $N_2$ gas was used as the reaction gas. The basal plate (substrate) temperature was set at 500° C. and the gas pressure in the apparatus was set at 4 Pa. From among the step of covering with first unit layer and the step of covering with second unit layer, the step of covering with first unit layer was performed first, and the step of covering with second unit layer was performed lastly.

Next, the series of steps composed of covering with second layer to covering with first layer was repeated the number of times described in the item "Number of repetitions of covering with second layer to covering with first layer" in Table 13. For example, in sample No. 4-1, the series of steps composed of covering with second layer to covering with first layer was repeated three times. In other words, in the coating film of sample No. 4-1, the second layers and the first layers are alternately laminated and three layers each of the second layers and the first layers are included.

TABLE 13

| Sample No. | Covering with second layer Bias voltage [V] | Step (i) Annealing Temperature [° C.]/ Time [min] | Step (ii) Ion bombardment | Step (iv) Bias voltage [V] | Covering with first layer/ second unit layer (Step(iii)) Bias voltage [V] | Number of repetitions of covering with second layer to covering with first layer |
|---|---|---|---|---|---|---|
| 4-1 | 30 | — | — | 32 | 35 | 3 |
| 4-2 | 30 | — | — | 32 | 35 | 3 |
| 4-3 | 800 | — | — | 700 | 35 | 3 |
| 4-4 | 800 | — | — | 700 | 35 | 3 |
| 4-5 | 30 | — | — | 33 | 35 | 3 |
| 4-6 | 30 | — | — | 33 | 35 | 3 |
| 4-7 | 30 | — | — | 33 | 35 | 3 |
| 4-8 | 23 | 500/30 | — | 24 | 25 | 3 |
| 4-9 | 30 | — | — | 33 | 50 | 3 |
| 4-10 | 30 | — | — | 33 | 35 | 3 |
| 4-11 | 30 | — | — | 33 | 35 | 3 |
| 4-12 | 30 | — | — | 33 | 35 | 3 |
| 4-13 | 30 | — | — | 33 | 35 | 3 |
| 4-14 | 30 | — | — | 33 | 35 | 3 |
| 4-15 | 30 | — | — | 33 | 35 | 3 |
| 4-16 | 30 | — | — | 33 | 35 | 3 |
| 4-17 | 30 | — | — | 33 | 35 | 3 |
| 4-18 | 30 | — | — | 33 | 35 | 3 |
| 4-19 | 30 | — | — | 33 | 35 | 3 |
| 4-20 | 30 | — | — | 33 | 35 | 3 |
| 4-21 | 30 | — | — | 33 | 35 | 3 |
| 4-22 | 30 | — | — | 33 | 35 | 3 |
| 4-23 | 30 | — | — | 33 | 35 | 3 |
| 4-24 | 30 | — | — | 33 | 35 | 3 |
| 4-25 | 30 | — | — | 33 | 35 | 3 |
| 4-26 | 30 | — | — | 33 | 35 | 3 |
| 4-27 | 30 | — | Ar(−800 V) | 33 | 35 | 3 |
| 4-28 | 30 | — | — | 33 | 35 | 3 |

Characterization of Cutting Tools

With regard to the cutting tools of samples No. 4-1 to No 4-28 thus prepared. "", "y" and "z" in the composition of the first unit layer $Ti_xAl_yM_{1-x-y}C_zN_{1-z}$, "thickness of first unit layer", "m" in the composition of the second unit layer $Al_mCr_{1-m}N$.

"thickness of second unit layer", "a", "b" and "c" in the composition of the second layer $Ti_aAl_bC_cN_{1-c}$, "thickness of first layer", "thickness of second layer", "hardness of first layer $H_1$", "hardness of second layer $H_2$", "$I_{(200)}/(I_{(200)}+I_{(111)}+I_{(220)})$" ("$R_{(200)}$"), "$I_{(111)}/(I_{(200)}+I_{(111)}+I_{(220)})$" ("$R_{(111)}$"), and "$I_{(220)}/(I_{(200)}+I_{(111)}+I_{(220)})$" ("$R_{(220)}$") were determined, respectively, by measurement in the same manner as in Example 1. The results obtained each are shown in Table 14. Here, "thickness of first unit layer", represents the thickness of one first unit layer, "thickness of second unit layer" represents the thickness of one second unit layer, "thickness of first layer" represents the thickness of one first layer, and "thickness of second layer" represents the thickness of one second layer. For example, in sample 4-1, the first layer was formed by alternately laminating the first unit layers with a thickness of 15 nm and the second unit layers with a thickness of 10 nm, and the thickness Ti of the first layer was 0.5 μm. In the coating film, there exist three layers of the first layers and three layers of the second layers having a thickness $T_2$ of 0.5 μm. The cutting tools of samples No. 4-1 to No. 4-28 correspond to Examples.

TABLE 14

| | First layer | | | | | | | | | | |
|---|---|---|---|---|---|---|---|---|---|---|---|
| | First unit layer | | | | Second unit layer | | Substrate side/ Surface side | Thickness $T_1$ [μm] | Hardness $H_1$ [GPa] | $0.5 \times H_1$ | $0.9 \times H_1$ |
| Sample No | Composition | x | y | z | Thickness [nm] | Composition | m | Thickness [nm] | | | | | |

| Sample No | Composition | x | y | z | Thickness [nm] | Composition | m | Thickness [nm] | Substrate side/ Surface side | $T_1$ [μm] | $H_1$ [GPa] | $0.5 \times H_1$ | $0.9 \times H_1$ |
|---|---|---|---|---|---|---|---|---|---|---|---|---|---|
| 4-1 | TiAlSiN | 0.49 | 0.49 | 1 | 15 | AlCrN | 0.7 | 10 | Surface side | 0.5 | 37 | 18.5 | 33.3 |
| 4-2 | TiAlBN | 0.49 | 0.49 | 1 | 15 | AlCrN | 0.7 | 10 | Surface side | 0.5 | 38 | 19.0 | 34.2 |
| 4-3 | TiAlSiN | 0.49 | 0.49 | 1 | 15 | AlCrN | 0.7 | 10 | Surface side | 0.5 | 37 | 18.5 | 33.3 |
| 4-4 | TiAlBN | 0.49 | 0.49 | 1 | 15 | AlCrN | 0.7 | 10 | Surface side | 0.5 | 38 | 19.0 | 34.2 |
| 4-5 | TiAlSiN | 0.49 | 0.49 | 1 | 15 | AlCrN | 0.7 | 10 | Substrate side | 0.5 | 37 | 18.5 | 33.3 |
| 4-6 | TiAlSiN | 0.49 | 0.49 | 1 | 15 | CrN | 0 | 10 | Surface side | 0.5 | 37 | 18.5 | 33.3 |
| 4-7 | TiAlSiN | 0.49 | 0.49 | 1 | 15 | AlCrN | 0.8 | 10 | Surface side | 0.5 | 37 | 18.5 | 33.3 |
| 4-8 | TiAlSiN | 0.49 | 0.49 | 1 | 15 | AlCrN | 0.7 | 10 | Surface side | 0.5 | 25 | 18.5 | 33.3 |
| 4-9 | TiAlSiN | 0.49 | 0.49 | 1 | 15 | AlCrN | 0.7 | 10 | Surface side | 0.5 | 40 | 18.5 | 33.3 |
| 4-10 | TiAlSiN | 0.49 | 0.49 | 1 | 15 | AlCrN | 0.7 | 10 | Surface side | 0.2 | 37 | 18.5 | 33.3 |
| 4-11 | TiAlSiN | 0.49 | 0.49 | 1 | 15 | AlCrN | 0.7 | 10 | Surface side | 10 | 37 | 18.5 | 33.3 |
| 4-12 | TiAlSiN | 0.49 | 0.49 | 1 | 15 | AlCrN | 0.7 | 10 | Surface side | 0.5 | 37 | 18.5 | 33.3 |
| 4-13 | TiAlN | 0.99 | 0.01 | 0 | 15 | AlCrN | 0.7 | 10 | Surface side | 0.5 | 37 | 18.5 | 33.3 |
| 4-14 | TiAlN | 0.20 | 0.80 | 0 | 15 | AlCrN | 0.7 | 10 | Surface side | 0.5 | 37 | 18.5 | 33.3 |
| 4-15 | TiAlSiN | 0.20 | 0.79 | 0 | 15 | AlCrN | 0.7 | 10 | Surface side | 0.5 | 37 | 18.5 | 33.3 |
| 4-16 | TiAlBN | 0.98 | 0.01 | 0 | 15 | AlCrN | 0.7 | 10 | Surface side | 0.5 | 37 | 18.5 | 33.3 |
| 4-17 | TiAlYN | 0.50 | 0.30 | 0 | 15 | AlCrN | 0.7 | 10 | Surface side | 0.5 | 37 | 18.5 | 33.3 |
| 4-18 | TiAlZrN | 0.49 | 0.49 | 0 | 15 | AlCrN | 0.7 | 10 | Surface side | 0.5 | 37 | 18.5 | 33.3 |
| 4-19 | TiAlHfN | 0.49 | 0.49 | 0 | 15 | AlCrN | 0.7 | 10 | Surface side | 0.5 | 37 | 18.5 | 33.3 |
| 4-20 | TiAlVN | 0.49 | 0.49 | 0 | 15 | AlCrN | 0.7 | 10 | Surface side | 0.5 | 37 | 18.5 | 33.3 |
| 4-21 | TiAlNbN | 0.49 | 0.49 | 0 | 15 | AlCrN | 0.7 | 10 | Surface side | 0.5 | 37 | 18.5 | 33.3 |
| 4-22 | TiAlTaN | 0.49 | 0.49 | 0 | 15 | AlCrN | 0.7 | 10 | Surface side | 0.5 | 37 | 18.5 | 33.3 |
| 4-23 | TiAlCrN | 0.49 | 0.49 | 0 | 15 | AlCrN | 0.7 | 10 | Surface side | 0.5 | 37 | 18.5 | 33.3 |
| 4-24 | TiAlMoN | 0.49 | 0.49 | 0 | 15 | AlCrN | 0.7 | 10 | Surface side | 0.5 | 37 | 18.5 | 33.3 |
| 4-25 | TiAlWN | 0.49 | 0.49 | 0 | 15 | AlCrN | 0.7 | 10 | Surface side | 0.5 | 37 | 18.5 | 33.3 |
| 4-26 | TiAlSiN | 0.49 | 0.49 | 1 | 15 | AlCrN | 0.7 | 10 | Surface side | 0.5 | 37 | 18.5 | 33.3 |
| 4-27 | TiAlSiN | 0.49 | 0.49 | 1 | 15 | AlCrN | 0.7 | 10 | Surface side | 0.5 | 37 | 18.5 | 33.3 |
| 4-28 | TiAlSiN | 0.49 | 0.49 | 1 | 15 | AlCrN | 0.7 | 10 | Surface side | 0.5 | 37 | 18.5 | 33.3 |

| Sample No | Second layer Composition | Substrate side/ Surface side | Thickness $T_2$ [μm] | Hardness $H_2$ [GPa] | $T_1/T_2$ | $R_{(200)}$ | $R_{(111)}$ | $R_{(220)}$ | Cutting evaluation Maximum amount of wear [μm] |
|---|---|---|---|---|---|---|---|---|---|
| 4-1 | $Ti_{0.5}Al_{0.5}N$ | Substrate side | 0.5 | 27 | 1.00 | 0.88 | 0.05 | 0.07 | 241 |
| 4-2 | $Ti_{0.5}Al_{0.5}N$ | Substrate side | 0.5 | 27 | 1.00 | 0.84 | 0.07 | 0.09 | 239 |
| 4-3 | $TiC_{0.1}N_{0.9}$ | Substrate side | 0.5 | 22 | 1.00 | 0.32 | 0.20 | 0.48 | 258 |
| 4-4 | $TiC_{0.1}N_{0.9}$ | Substrate side | 0.5 | 22 | 1.00 | 0.33 | 0.17 | 0.50 | 255 |
| 4-5 | $Ti_{0.5}Al_{0.5}N$ | Surface side | 0.5 | 27 | 1.00 | 0.84 | 0.04 | 0.12 | 263 |
| 4-6 | $Ti_{0.5}Al_{0.5}N$ | Substrate side | 0.5 | 27 | 1.00 | 0.82 | 0.04 | 0.14 | 280 |
| 4-7 | $Ti_{0.5}Al_{0.5}N$ | Substrate side | 0.5 | 27 | 1.00 | 0.84 | 0.02 | 0.14 | 279 |
| 4-8 | $Ti_{0.5}Al_{0.5}N$ | Substrate side | 0.5 | 22 | 1.00 | 0.85 | 0.04 | 0.11 | 271 |
| 4-9 | $Ti_{0.5}Al_{0.5}N$ | Substrate side | 0.5 | 27 | 1.00 | 0.85 | 0.06 | 0.09 | 285 |
| 4-10 | $Ti_{0.5}Al_{0.5}N$ | Substrate side | 10.0 | 27 | 0.02 | 0.84 | 0.06 | 0.10 | 281 |
| 4-11 | $Ti_{0.5}Al_{0.5}N$ | Substrate side | 0.2 | 27 | 50.00 | 0.85 | 0.04 | 0.11 | 286 |
| 4-12 | $Ti_{0.5}Al_{0.5}N$ | Substrate side | 0.5 | 27 | 1.00 | 0.43 | 0.45 | 0.12 | 282 |
| 4-13 | $Ti_{0.5}Al_{0.5}N$ | Substrate side | 0.5 | 27 | 1.00 | 0.85 | 0.02 | 0.13 | 273 |
| 4-14 | $Ti_{0.5}Al_{0.5}N$ | Substrate side | 0.5 | 27 | 1.00 | 0.86 | 0.05 | 0.09 | 270 |
| 4-15 | $Ti_{0.5}Al_{0.5}N$ | Substrate side | 0.5 | 27 | 1.00 | 0.87 | 0.06 | 0.07 | 265 |
| 4-16 | $Ti_{0.5}Al_{0.5}N$ | Substrate side | 0.5 | 27 | 1.00 | 0.85 | 0.09 | 0.06 | 288 |
| 4-17 | $Ti_{0.5}Al_{0.5}N$ | Substrate side | 0.5 | 27 | 1.00 | 0.83 | 0.08 | 0.09 | 277 |
| 4-18 | $Ti_{0.5}Al_{0.5}N$ | Substrate side | 0.5 | 27 | 1.00 | 0.85 | 0.04 | 0.11 | 269 |
| 4-19 | $Ti_{0.5}Al_{0.5}N$ | Substrate side | 0.5 | 27 | 1.00 | 0.82 | 0.05 | 0.13 | 279 |
| 4-20 | $Ti_{0.5}Al_{0.5}N$ | Substrate side | 0.5 | 27 | 1.00 | 0.82 | 0.06 | 0.12 | 279 |
| 4-21 | $Ti_{0.5}Al_{0.5}N$ | Substrate side | 0.5 | 27 | 1.00 | 0.85 | 0.02 | 0.13 | 261 |
| 4-22 | $Ti_{0.5}Al_{0.5}N$ | Substrate side | 0.5 | 27 | 1.00 | 0.86 | 0.05 | 0.09 | 287 |
| 4-23 | $Ti_{0.5}Al_{0.5}N$ | Substrate side | 0.5 | 27 | 1.00 | 0.81 | 0.03 | 0.16 | 282 |
| 4-24 | $Ti_{0.5}Al_{0.5}N$ | Substrate side | 0.5 | 27 | 1.00 | 0.85 | 0.02 | 0.13 | 273 |
| 4-25 | $Ti_{0.5}Al_{0.5}N$ | Substrate side | 0.5 | 27 | 1.00 | 0.85 | 0.05 | 0.10 | 268 |

TABLE 14-continued

| | | | | | | | | |
|---|---|---|---|---|---|---|---|---|
| 4-26 | $Ti_{0.2}Al_{0.8}N$ | Substrate side | 0.5 | 27 | 1.00 | 0.84 | 0.06 | 0.10 | 283 |
| 4-27 | TiN | Substrate side | 0.5 | 25 | 1.00 | 0.82 | 0.02 | 0.16 | 260 |
| 4-28 | $Ti_{0.5}Al_{0.5}C$ | Substrate side | 0.5 | 27 | 1.00 | 0.81 | 0.044 | 0.146 | 263 |

Cutting Test

The cutting tools of samples No. 4-1 to No. 4-28 thus prepared were subjected to "cutting test" in the same manner as in Example 1 so as to determine the "maximum amount of wear". The results obtained each are described in item "Maximum amount of wear [μm]" in Table 14.

Results

Samples No. 4-1 to No. 4-28 correspond to Examples. From the results in Table 14, it has been confirmed that the cutting tools of samples No. 4-1 to No. 4-28 corresponding to Examples have a long tool life even in high-load cutting such as cutting of high-hardness materials such as hardened steel. The reason for this is presumed as follows. As in Example I, in the cutting tools of samples No. 4-1 to No. 4-28, the first layer of the coating film has high hardness and good abrasion resistance, and the coating film includes the second layer together with the first layer, so that the coating film has good chipping resistance and peeling resistance. Thereby, the coating film is less likely to break during cutting, and the wear originating from there is suppressed.

Example 5

Preparation of Cutting Tool

Samples No. 5-1 to No. 5-28

By the following manufacturing method, cutting tools of samples No. 5-1 to No. 5-28 were prepared.

Step of Preparing Substrate

As substrate preparation step, the same substrate as that in samples No. 1-1 to No. 1-15, samples No. 1-17 to No. 1-34, and samples No. 1-101 to No. 1-106 was prepared, and the substrate was set at a predetermined position of an are ion plating apparatus.

Step of Forming Coating Film on Substrate

As step of covering with second layer, a second layer was formed on the surface of the substrate using arc ion plating method under the same conditions as in samples No. 1-1 to No. 1-15, samples No. 1-17 to No. 1-34, and samples No. 1-101 to No. 1-106 except that covering with second layer was performed under the conditions described in Table 15 and the following targets were used as metal evaporation source. As the metal evaporation source, a target corresponding to the "composition" of the second layer described in the following Table 16 was used. Specifically, in the case where the composition of the second layer was TiAlN or TiAlC, a TiAl target was used as the metal evaporation source. In the case where the composition of the second layer was TiN, a Ti target was used as the metal evaporation source.

Next, as step (iv). the bias voltage was changed from the bias voltage value in covering with second layer to the bias voltage value described in column "Step (iv)" in Table 15 so as to perform film formation for 60 seconds. Subsequently, the film formation conditions other than the bias voltage were changed to the following conditions for covering with first layer, and film formation was performed for 60 seconds while maintaining the bias voltage. Steps (i) and (ii) were not performed.

Next, as covering with first laver, using are ion plating method under the conditions described in Table 15. the step of covering with first unit layer and the step of covering with third unit layer were alternately performed to form the first layer on the surface of the second layer. Specifically, the following method was used. As the metal evaporation source, a target corresponding to the "composition" of the first layer described in the following Table 16 was used. In other words, in the case where the composition of the first unit layer was TiAlN, a TiAl target was used as the metal evaporation source. Also, in the case where the composition of the first unit layer was TiAlSiN, a TiAlSi target was used as the metal evaporation source. Also, in the case where the composition of the third unit layer was TiAlN, a TiAl target was used as the metal evaporation source. Also, in the case where the composition of the third unit layer was AlN, an Al target was used as the metal evaporation source. $N_2$ gas was used as the reaction gas. The basal plate (substrate) temperature was set at 500° C. and the gas pressure in the apparatus was set at 4 Pa. From among the step of covering with first unit layer and the step of covering with third unit layer, the step of covering with first unit layer was performed first, and the step of covering with third unit layer was performed lastly.

Next, as step (iii), the series of steps composed of covering with second layer to covering with first layer was repeated the number of times described in the item "Number of repetitions of step of covering with second layer to step of covering first layer" in Table 15. For example, in sample No. 5-1, the series of steps composed of covering with second layer to covering with first layer was repeated three times. In other words, in the coating film of sample No. 5-1, the second layers and the first layers are alternately laminated and three layers each of the second layers and the first layers are included.

TABLE 15

| Sample No. | Covering with second layer Bias voltage [V] | Step (i) Annealing Temperature [° C.]/ Time [min] | Step (ii) Ion bombardment | Step (iv) Bias voltage [V] | Covering with first layer Covering with first unit layer/ third unit layer (Step(iii)) Bias voltage [V] | Number of repetitions of covering with second layer to covering with first layer |
|---|---|---|---|---|---|---|
| 5-1 | 30 | — | — | 32 | 35 | 3 |
| 5-2 | 30 | — | — | 32 | 35 | 3 |
| 5-3 | 800 | — | — | 700 | 35 | 3 |
| 5-4 | 800 | — | — | 700 | 35 | 3 |

TABLE 15-continued

| Sample No. | Covering with second layer Bias voltage [V] | Step (i) Annealing Temperature [° C.]/Time [min] | Step (ii) Ion bombardment | Step (iv) Bias voltage [V] | Covering with first layer Covering with first unit layer/third unit layer (Step(iii)) Bias voltage [V] | Number of repetitions of covering with second layer to covering with first layer |
|---|---|---|---|---|---|---|
| 5-5 | 30 | — | — | 33 | 35 | 3 |
| 5-6 | 30 | — | — | 33 | 35 | 3 |
| 5-7 | 30 | — | — | 33 | 35 | 3 |
| 5-8 | 23 | 500/30 | — | 24 | 25 | 3 |
| 5-9 | 30 | — | — | 33 | 50 | 3 |
| 5-10 | 30 | — | — | 33 | 35 | 3 |
| 5-11 | 30 | — | — | 33 | 35 | 3 |
| 5-12 | 30 | — | — | 33 | 35 | 3 |
| 5-13 | 30 | — | — | 33 | 35 | 3 |
| 5-14 | 30 | — | — | 33 | 35 | 3 |
| 5-15 | 30 | — | — | 33 | 35 | 3 |
| 5-16 | 30 | — | — | 33 | 35 | 3 |
| 5-17 | 30 | — | — | 33 | 35 | 3 |
| 5-18 | 30 | — | — | 33 | 35 | 3 |
| 5-19 | 30 | — | — | 33 | 35 | 3 |
| 5-20 | 30 | — | — | 33 | 35 | 3 |
| 5-21 | 30 | — | — | 33 | 35 | 3 |
| 5-22 | 30 | — | — | 33 | 35 | 3 |
| 5-23 | 30 | — | — | 33 | 35 | 3 |
| 5-24 | 30 | — | — | 33 | 35 | 3 |
| 5-25 | 30 | — | — | 33 | 35 | 3 |
| 5-26 | 30 | — | — | 33 | 35 | 3 |
| 5-27 | 30 | — | Ar(−800 V) | 33 | 35 | 3 |
| 5-28 | 30 | — | — | 33 | 35 | 3 |

Characterization of Cutting Tools

With regard to the cutting tools of samples No. 5-1 to No. 5-28 thus prepared, "x", "y" and "z" in the composition of the first unit layer $Ti_xAl_yM_{1-x-y}C_zN_{1-z}$, "thickness of first unit layer", "n" in the composition of the third unit layer $Ti_nAl_{1-n}N$, "thickness of second unit layer", "a", "b" and "c" in the composition of the second layer $Ti_aAl_bC_cN_{1-c}$, "thickness of first layer", "thickness of second layer", "hardness of first layer $H_1$", "hardness of second layer $H_2$", "$I_{(200)}/(I_{(200)}+I_{(111)}+I_{(220)})$", "$I_{(111)}/(I_{(200)}+I_{(111)}+I_{(220)})$", and "$I_{(220)}/(I_{(200)}+I_{(111)}+I_{(220)})$" were determined, respectively. by measurement in the same manner as in Example 1. The results obtained each are shown in Table 16. Here, "thickness of first unit layer", represents the thickness of one first unit layer, "thickness of third unit layer" represents the thickness of one third unit layer, "thickness of first layer" represents the thickness of one first layer, and "thickness of second layer" represents the thickness of one second layer. For example, in sample No. 5-1, the first layer was formed by alternately laminating the first unit layers with a thickness of 10 nm and the second unit layers with a thickness of 15 nm, and the thickness Ti of the first layer was 0.5 μm. In the coating film, there exist three layers of the first layers and three layers of the second layer having a thickness $T_2$ of 0.5 μm. The cutting tools of samples No. 5-1 to No. 5-28 correspond to Examples.

TABLE 16

| | First layer | | | | | | | | | | |
|---|---|---|---|---|---|---|---|---|---|---|---|
| | First unit layer | | | | Third unit layer | | Substrate side/ Surface side | Thickness $T_1$ [μm] | Hardness $H_1$ [GPa] | $0.5 \times H_1$ | $0.9 \times H_1$ |
| Sample No | Composition | x | y | z | Thickness [nm] | Composition | n | Thickness [nm] | | | | |
| 5-1 | TiAlSiN | 0.49 | 0.49 | 1 | 10 | TiAlN | 0.5 | 15 | Surface side | 0.5 | 37 | 18.5 | 33.3 |
| 5-2 | TiAlBN | 0.49 | 0.49 | 1 | 10 | TiAlN | 0.5 | 15 | Surface side | 0.5 | 38 | 19 | 34.2 |
| 5-3 | TiAlSiN | 0.49 | 0.49 | 1 | 10 | TiAlN | 0.5 | 15 | Surface side | 0.5 | 37 | 18.5 | 33.3 |
| 5-4 | TiAlBN | 0.49 | 0.49 | 1 | 10 | TiAlN | 0.5 | 15 | Surface side | 0.5 | 38 | 19.0 | 34.2 |
| 5-5 | TiAlSiN | 0.49 | 0.49 | 1 | 10 | TiAlN | 0.5 | 15 | Substrate side | 0.5 | 37 | 18.5 | 33.3 |
| 5-6 | TiAlSiN | 0.49 | 0.49 | 1 | 10 | TiN | 0 | 15 | Surface side | 0.5 | 37 | 18.5 | 33.3 |
| 5-7 | TiAlSiN | 0.49 | 0.49 | 1 | 10 | TiAlN | 0.8 | 15 | Surface side | 0.5 | 37 | 18.5 | 33.3 |
| 5-8 | TiAlSiN | 0.49 | 0.49 | 1 | 10 | TiAlN | 0.5 | 15 | Surface side | 0.5 | 25 | 18.5 | 33.3 |
| 5-9 | TiAlSiN | 0.49 | 0.49 | 1 | 10 | TiAlN | 0.5 | 15 | Surface side | 0.5 | 40 | 18.5 | 33.3 |
| 5-10 | TiAlSiN | 0.49 | 0.49 | 1 | 10 | TiAlN | 0.5 | 15 | Surface side | 0.2 | 37 | 18.5 | 33.3 |
| 5-11 | TiAlSiN | 0.49 | 0.49 | 1 | 10 | TiAlN | 0.5 | 15 | Surface side | 10.0 | 37 | 18.5 | 33.3 |
| 5-12 | TiAlSiN | 0.49 | 0.49 | 1 | 10 | TiAlN | 0.5 | 15 | Surface side | 0.5 | 37 | 18.5 | 33.3 |
| 5-13 | TiAlN | 0.99 | 0.01 | 0 | 10 | TiAlN | 0.5 | 15 | Surface side | 0.5 | 37 | 18.5 | 33.3 |
| 5-14 | TiAlN | 0.20 | 0.80 | 0 | 10 | TiAlN | 0.5 | 15 | Surface side | 0.5 | 37 | 18.5 | 33.3 |
| 5-15 | TiAlSiN | 0.20 | 0.79 | 1 | 10 | TiAlN | 0.5 | 15 | Surface side | 0.5 | 37 | 18.5 | 33.3 |
| 5-16 | TiAlBN | 0.98 | 0.01 | 1 | 10 | TiAlN | 0.5 | 15 | Surface side | 0.5 | 37 | 18.5 | 33.3 |
| 5-17 | TiAlYN | 0.50 | 0.30 | 0 | 10 | TiAlN | 0.5 | 15 | Surface side | 0.5 | 37 | 18.5 | 33.3 |
| 5-18 | TiAlZrN | 0.49 | 0.49 | 0 | 10 | TiAlN | 0.5 | 15 | Surface side | 0.5 | 37 | 18.5 | 33.3 |

TABLE 16-continued

| Sample No | | | | | | | | | | | | |
|---|---|---|---|---|---|---|---|---|---|---|---|---|
| 5-19 | TiAlHfN | 0.49 | 0.49 | 0 | 10 | TiAlN | 0.5 | 15 | Surface side | 0.5 | 37 | 18.5 | 33.3 |
| 5-20 | TiAlVN | 0.49 | 0.49 | 0 | 10 | TiAlN | 0.5 | 15 | Surface side | 0.5 | 37 | 18.5 | 33.3 |
| 5-21 | TiAlNbN | 0.49 | 0.49 | 0 | 10 | TiAlN | 0.5 | 15 | Surface side | 0.5 | 37 | 18.5 | 33.3 |
| 5-22 | TiAlTaN | 0.49 | 0.49 | 0 | 10 | TiAlN | 0.5 | 15 | Surface side | 0.5 | 37 | 18.5 | 33.3 |
| 5-23 | TiAlCrN | 0.49 | 0.49 | 0 | 10 | TiAlN | 0.5 | 15 | Surface side | 0.5 | 37 | 18.5 | 33.3 |
| 5-24 | TiAlMoN | 0.49 | 0.49 | 0 | 10 | TiAlN | 0.5 | 15 | Surface side | 0.5 | 37 | 18.5 | 33.3 |
| 5-25 | TiAlWN | 0.49 | 0.49 | 0 | 10 | TiAlN | 0.5 | 15 | Surface side | 0.5 | 37 | 18.5 | 33.3 |
| 5-26 | TiAlSiN | 0.49 | 0.49 | 1 | 10 | TiAlN | 0.5 | 15 | Surface side | 0.5 | 37 | 18.5 | 33.3 |
| 5-27 | TiAlSiN | 0.49 | 0.49 | 1 | 10 | TiAlN | 0.5 | 15 | Surface side | 0.5 | 37 | 18.5 | 33.3 |
| 5-28 | TiAlSiN | 0.49 | 0.49 | 1 | 10 | TiAlN | 0.5 | 15 | Surface side | 0.5 | 37 | 18.5 | 33.3 |

| Sample No | Second layer | | | | | | | | Cutting evaluation Maximum amount of wear [μm] |
|---|---|---|---|---|---|---|---|---|---|
| | Composition | Substrate side/ Surface side | Thickness $T_2$ [μm] | Hardness $H_2$ [GPa] | $T_1/T_2$ | $R_{(200)}$ | $R_{(111)}$ | $R_{(220)}$ | |
| 5-1 | $Ti_{0.5}Al_{0.5}N$ | Substrate side | 0.5 | 27 | 1.00 | 0.87 | 0.04 | 0.09 | 221 |
| 5-2 | $Ti_{0.5}Al_{0.5}N$ | Substrate side | 0.5 | 27 | 1.00 | 0.89 | 0.03 | 0.08 | 242 |
| 5-3 | $TiC_{0.1}N_{0.9}$ | Substrate side | 0.5 | 22 | 1.00 | 0.31 | 0.20 | 0.49 | 251 |
| 5-4 | $TiC_{0.1}N_{0.9}$ | Substrate side | 0.5 | 22 | 1.00 | 0.33 | 0.11 | 0.56 | 248 |
| 5-5 | $Ti_{0.5}Al_{0.5}N$ | Surface side | 0.5 | 27 | 1.00 | 0.82 | 0.03 | 0.15 | 265 |
| 5-6 | $Ti_{0.5}Al_{0.5}N$ | Substrate side | 0.5 | 27 | 1.00 | 0.84 | 0.02 | 0.14 | 267 |
| 5-7 | $Ti_{0.5}Al_{0.5}N$ | Substrate side | 0.5 | 27 | 1.00 | 0.85 | 0.04 | 0.11 | 288 |
| 5-8 | $Ti_{0.5}Al_{0.5}N$ | Substrate side | 0.5 | 22 | 1.00 | 0.83 | 0.02 | 0.15 | 281 |
| 5-9 | $Ti_{0.5}Al_{0.5}N$ | Substrate side | 0.5 | 27 | 1.00 | 0.82 | 0.03 | 0.15 | 277 |
| 5-10 | $Ti_{0.5}Al_{0.5}N$ | Substrate side | 10.0 | 27 | 0.02 | 0.85 | 0.04 | 0.11 | 262 |
| 5-11 | $Ti_{0.5}Al_{0.5}N$ | Substrate side | 0.2 | 27 | 50.00 | 0.84 | 0.02 | 0.14 | 272 |
| 5-12 | $Ti_{0.5}Al_{0.5}N$ | Substrate side | 0.5 | 27 | 1.00 | 0.43 | 0.45 | 0.12 | 272 |
| 5-13 | $Ti_{0.5}Al_{0.5}N$ | Substrate side | 0.5 | 27 | 1.00 | 0.84 | 0.05 | 0.11 | 261 |
| 5-14 | $Ti_{0.5}Al_{0.5}N$ | Substrate side | 0.5 | 27 | 1.00 | 0.82 | 0.01 | 0.17 | 279 |
| 5-15 | $Ti_{0.5}Al_{0.5}N$ | Substrate side | 0.5 | 27 | 1.00 | 0.85 | 0.02 | 0.13 | 272 |
| 5-16 | $Ti_{0.5}Al_{0.5}N$ | Substrate side | 0.5 | 27 | 1.00 | 0.87 | 0.04 | 0.09 | 275 |
| 5-17 | $Ti_{0.5}Al_{0.5}N$ | Substrate side | 0.5 | 27 | 1.00 | 0.88 | 0.02 | 0.10 | 265 |
| 5-18 | $Ti_{0.5}Al_{0.5}N$ | Substrate side | 0.5 | 27 | 1.00 | 0.85 | 0.05 | 0.10 | 260 |
| 5-19 | $Ti_{0.5}Al_{0.5}N$ | Substrate side | 0.5 | 27 | 1.00 | 0.86 | 0.02 | 0.12 | 269 |
| 5-20 | $Ti_{0.5}Al_{0.5}N$ | Substrate side | 0.5 | 27 | 1.00 | 0.84 | 0.03 | 0.13 | 282 |
| 5-21 | $Ti_{0.5}Al_{0.5}N$ | Substrate side | 0.5 | 27 | 1.00 | 0.82 | 0.04 | 0.14 | 289 |
| 5-22 | $Ti_{0.5}Al_{0.5}N$ | Substrate side | 0.5 | 27 | 1.00 | 0.85 | 0.02 | 0.13 | 266 |
| 5-23 | $Ti_{0.5}Al_{0.5}N$ | Substrate side | 0.5 | 27 | 1.00 | 0.85 | 0.04 | 0.11 | 281 |
| 5-24 | $Ti_{0.5}Al_{0.5}N$ | Substrate side | 0.5 | 27 | 1.00 | 0.85 | 0.02 | 0.13 | 274 |
| 5-25 | $Ti_{0.5}Al_{0.5}N$ | Substrate side | 0.5 | 27 | 1.00 | 0.81 | 0.02 | 0.17 | 269 |
| 5-26 | $Ti_{0.2}Al_{0.8}N$ | Substrate side | 0.5 | 27 | 1.00 | 0.85 | 0.05 | 0.10 | 273 |
| 5-27 | TiN | Substrate side | 0.5 | 25 | 1.00 | 0.82 | 0.02 | 0.16 | 276 |
| 5-28 | $Ti_{0.5}Al_{0.5}C$ | Substrate side | 0.5 | 27 | 1.00 | 0.82 | 0.04 | 0.14 | 269 |

Cutting Test

The cutting tools of samples No. 5-1 to No. 5-28 thus prepared were subjected to "cutting test" in the same manner as in Example 1 so as to determine the "maximum amount of wear". The results obtained each are described in item "Maximum amount of wear [μm]" in Table 16.

Results

Samples No. 5-1 to No. 5-28 correspond to Examples. From the results in Table 16, it has been confirmed that the cutting tools of samples No. 5-1 to No. 5-28 corresponding to Examples have a long tool life even in high-load cutting such as cutting of high-hardness materials such as hardened steel. The reason for this is presumed as follows. As in Example 1, in the cutting tools of samples No. 5-1 to No. 5-28, the first layer of the coating film has high hardness and good abrasion resistance, and the coating film includes the second layer together with the first layer, so that the coating film has good chipping resistance and peeling resistance. Thereby, the coating film is less likely to break during cutting, and the wear originating from there is suppressed.

Although the embodiment and Examples of the present disclosure have been explained as stated above, an appropriate combination and various modifications of the constitution of each of the embodiments and Examples described above are also expected from the beginning.

The embodiment and Examples disclosed herein are exemplification in all respects and should not be considered to be restrictive. The scope of the present invention is not represented by the embodiment and Examples but by the claims, and intended to include equivalent to the scope of the claims and all the changes within the scope of the claims.

REFERENCE SIGNS LIST 1 rake face: 2 flank face: 3 cutting edge ridgeline; 10 cutting tool; 11 substrate; 12 first layer: 13 second layer; 14 foundation layer; 15 intermediate layer; 16 surface layer; 40 coating film; 121 first unit layer; 122 second unit layer: 123 third unit layer: 131 fourth unit layer: A1 and A2 X-ray diffraction peaks derived from (200) plane

The invention claimed is:

1. A cutting tool comprising a substrate and a coating film disposed on the substrate, wherein
the coating film comprises a first layer and a second layer:
the first layer has a hardness $H_1$ of 25 GPa or more and 40 GPa or less:
the second layer has a hardness $H_2$ satisfying $0.5 \times H_1 \leq H_2 \leq 0.9 \times H_1$;

at least one of a ratio $I_{(200)}/(I_{(200)}+I_{(111)}+I_{(220)})$ of $I_{(200)}$ of (200) plane to a sum of X-ray diffraction intensity $I_{(200)}$ of (200) plane, X-ray diffraction intensity $I_{(111)}$ of (111) plane, and X-ray diffraction intensity $I_{(220)}$ of (220) plane of the coating film, a ratio $I_{(111)}/(I_{(200)}+I_{(111)}+I_{(220)})$ of $I_{(111)}$ to the sum, and a ratio $I_{(220)}/(I_{(200)}+I_{(111)}+I_{(220)})$ of $I_{(220)}$ to the sum is 0.45 or more;

the first layer consists of a first unit layer and a second unit layer;

the first unit layer is composed of $Ti_xAl_yM_{1-x-y}C_zN_{1-z}$;

M is one element selected from the group consisting of zirconium, hafnium, group V elements and group VI elements of the periodic table, silicon, boron, and yttrium;

x is 0.20 or more and 0.99 or less, y is 0.01 or more and 0.80 or less, 1-x-y is 0.01 or more and 0.20 or less, and z is 0 or more and 1.0 or less;

the second unit layer is composed of $Al_mCr_{1-m}N$;

m is 0 or more and 0.8 or less, the first unit layer has a thickness of 5 nm or more and 50 nm or less, the second unit layer has a thickness of 5 nm or more and 50 nm or less, and the first unit layer is in contact with the second unit layer and the first unit layer and the second unit layer are alternately laminated.

2. The cutting tool according to claim 1, wherein the first layer has a thickness $T_1$ of 0.2 μm or more and 10 μm or less.

3. The cutting tool according to claim 1, wherein the second layer has a thickness $T_2$ of 0.2 μm or more and 10 μm or less.

4. The cutting tool according to claim 1, wherein a ratio $T_1/T_2$ of thickness $T_1$ of the first layer to thickness $T_2$ of the second layer is 0.02 or more and 50 or less.

5. The cutting tool according to claim 1, wherein the second layer comprises a fourth unit layer;

the fourth unit layer is composed of $Ti_aAl_bC_cN_{1-c}$;

a is 0.2 or more and 1.0 or less, b is 0 or more and 0.8 or less, and c is 0 or more and 1.0 or less.

6. The cutting tool according to claim 5, wherein b and c are both greater than 0.

7. The cutting tool according to claim 1, wherein M is one element selected from the group consisting of zirconium, hafnium, group V elements and group VI elements of the periodic table, boron, and yttrium.

8. The cutting tool according to claim 1, wherein z is more than 0 and 1.0 or less.

9. A cutting tool comprising a substrate and a coating film disposed on the substrate, wherein the coating film comprises a first layer and a second layer:

the first layer has a hardness $H_1$ of 25 GPa or more and 40 GPa or less:

the second layer has a hardness $H_2$ satisfying $0.5 \times H_1 \le H_2 \le 0.9 \times H_1$;

at least one of a ratio $I_{(200)}/(I_{(200)}+I_{(111)}+I_{(220)})$ of $I_{(200)}$ of (200) plane to a sum of X-ray diffraction intensity $I_{(200)}$ of (200) plane, X-ray diffraction intensity $I_{(111)}$ of (111) plane, and X-ray diffraction intensity $I_{(220)}$ of (220) plane of the coating film, a ratio $I_{(111)}/(I_{(200)}+I_{(111)}+I_{(220)})$ of $I_{(111)}$ to the sum, and a ratio $I_{(220)}/(I_{(200)}+I_{(111)}+I_{(220)})$ of $I_{(220)}$ to the sum is 0.45 or more;

the first layer consists of a first unit layer and a third unit layer;

the first unit layer is composed of $Ti_xAl_yM_{1-x-y}C_zN_{1-z}$;

M is one element selected from the group consisting of zirconium, hafnium, group V elements and group VI elements of the periodic table, silicon, boron, and yttrium;

x is 0.20 or more and 0.99 or less, y is 0.01 or more and 0.80 or less, 1-x-y is 0.01 or more and 0.20 or less, and z is 0 or more and 1.0 or less;

the third unit layer is composed of $Ti_{1-n}Al_nN$;

n is 0 or more and 0.8 or less, the thickness of the first unit layer is 5 nm or more and 50 nm or less, the thickness of the third unit layer is 5 nm or more and 50 nm or less, and the first unit layer is in contact with the third unit layer and the first unit layer and the third unit layer are alternately laminated.

10. The cutting tool according to claim 9, wherein the first layer has a thickness $T_1$ of 0.2 μm or more and 10 μm or less.

11. The cutting tool according to claim 9, wherein the third layer has a thickness $T_2$ of 0.2 μm or more and 10 μm or less.

12. The cutting tool according to claim 9, wherein a ratio $T_1/T_2$ of thickness $T_1$ of the first layer to thickness $T_2$ of the second layer is 0.02 or more and 50 or less.

13. The cutting tool according to claim 9, wherein the third layer comprises a fourth unit layer;

the fourth unit layer is composed of $Ti_aAl_bC_cN_{1-c}$;

a is 0.2 or more and 1.0 or less, b is 0 or more and 0.8 or less, and c is 0 or more and 1.0 or less.

14. The cutting tool according to claim 13, wherein b and c are both greater than 0.

15. The cutting tool according to claim 9, wherein M is one element selected from the group consisting of zirconium, hafnium, group V elements and group VI elements of the periodic table, boron, and yttrium.

16. The cutting tool according to claim 9, wherein z is more than 0 and 1.0 or less.

* * * * *